(12) United States Patent
Muraoka et al.

(10) Patent No.: US 9,390,797 B2
(45) Date of Patent: Jul. 12, 2016

(54) DRIVING METHOD OF VARIABLE RESISTANCE ELEMENT AND NON-VOLATILE MEMORY DEVICE

(71) Applicant: PANASONIC CORPORATION, Osaka (JP)

(72) Inventors: Shunsaku Muraoka, Osaka (JP); Satoru Mitani, Osaka (JP); Takeshi Takagi, Kyoto (JP); Koji Katayama, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 146 days.

(21) Appl. No.: 13/983,017

(22) PCT Filed: Dec. 11, 2012

(86) PCT No.: PCT/JP2012/007912
§ 371 (c)(1),
(2) Date: Jul. 31, 2013

(87) PCT Pub. No.: WO2013/088704
PCT Pub. Date: Jun. 20, 2013

(65) Prior Publication Data
US 2014/0050014 A1 Feb. 20, 2014

(30) Foreign Application Priority Data

Dec. 13, 2011 (JP) ................................ 2011-271894
Dec. 13, 2011 (JP) ................................ 2011-271900

(51) Int. Cl.
*G11C 11/21* (2006.01)
*G11C 13/00* (2006.01)

(52) U.S. Cl.
CPC ........ *G11C 13/0069* (2013.01); *G11C 13/0007* (2013.01); *G11C 2013/0073* (2013.01);
(Continued)

(58) Field of Classification Search
CPC ........... G11C 13/0007; G11C 13/0069; G11C 2013/0073; G11C 2013/0083; H01L 45/08; H01L 45/146

USPC .............................. 365/148, 189.16; 438/104
See application file for complete search history.

(56) References Cited

U.S. PATENT DOCUMENTS 6,204,139 B1    3/2001  Liu et al.
7,369,431 B2 *  5/2008  Muraoka et al. .............. 365/163
(Continued)

FOREIGN PATENT DOCUMENTS

JP    2008-210441 A    9/2008
JP    2012-079372 A    4/2012

OTHER PUBLICATIONS

International Search Report issued in International Patent Application No. PCT/JP2012/007912 mailed on Jan. 29, 2013.

*Primary Examiner* — Richard Elms
*Assistant Examiner* — Xiaochun L Chen
(74) *Attorney, Agent, or Firm* — McDermott Will & Emery LLP

(57) ABSTRACT

A method of driving a variable resistance element comprises: before a first write step is performed, applying an initial voltage pulse of a first polarity to change a resistance value of a metal oxide layer from a resistance value corresponding to an initial state of the metal oxide layer to another resistance value; wherein when the resistance value corresponding to the initial state is R0, the resistance value corresponding to a write state is RL, the resistance value corresponding to an erase state is RH, another resistance value is R2, a maximum value of the current flowing when the initial voltage pulse is applied is IbRL, a maximum value of the current flowing when the write voltage pulse is applied is IRL, and a maximum value of the current flowing when the erase voltage pulse is applied is IRH, R0>RH>R2≥RL, and |IRL|>|IbRL| are satisfied.

15 Claims, 23 Drawing Sheets

(52) U.S. Cl.
CPC .... *G11C2013/0083* (2013.01); *G11C 2213/73* (2013.01); *G11C 2213/74* (2013.01); *G11C 2213/79* (2013.01)

(56) References Cited

U.S. PATENT DOCUMENTS

| | | |
|---|---|---|
| 7,384,792 B1 | 6/2008 | Wang et al. |
| 8,325,508 B2 * | 12/2012 | Kawai et al. .................. 365/148 |
| 8,395,925 B2 * | 3/2013 | Kawai ................ G11C 13/0007 365/148 |
| 2005/0206892 A1 | 9/2005 | Wang et al. |
| 2007/0115714 A1 * | 5/2007 | Muraoka et al. ............. 365/148 |
| 2007/0140900 A1 | 6/2007 | Wang et al. |
| 2007/0153267 A1 | 7/2007 | Wang et al. |
| 2007/0153269 A1 | 7/2007 | Wang et al. |
| 2007/0229817 A1 | 10/2007 | Wang et al. |
| 2008/0309918 A1 | 12/2008 | Guo et al. |
| 2009/0046284 A1 | 2/2009 | Wang et al. |
| 2009/0066946 A1 | 3/2009 | Wang et al. |
| 2009/0086202 A1 | 4/2009 | Wang et al. |
| 2010/0110424 A1 | 5/2010 | Wang et al. |
| 2010/0114514 A1 | 5/2010 | Wang et al. |
| 2011/0080770 A1 | 4/2011 | Muraoka et al. |
| 2011/0110144 A1 * | 5/2011 | Kawai et al. ................... 365/148 |
| 2011/0216574 A1 | 9/2011 | Ichihara et al. |
| 2011/0299322 A1 | 12/2011 | Iijima et al. |
| 2012/0120712 A1 * | 5/2012 | Kawai ................ G11C 13/0007 365/148 |
| 2012/0320661 A1 | 12/2012 | Muraoka et al. |
| 2012/0320662 A1 | 12/2012 | Ichihara et al. |
| 2013/0163308 A1 | 6/2013 | Iijima et al. |

\* cited by examiner

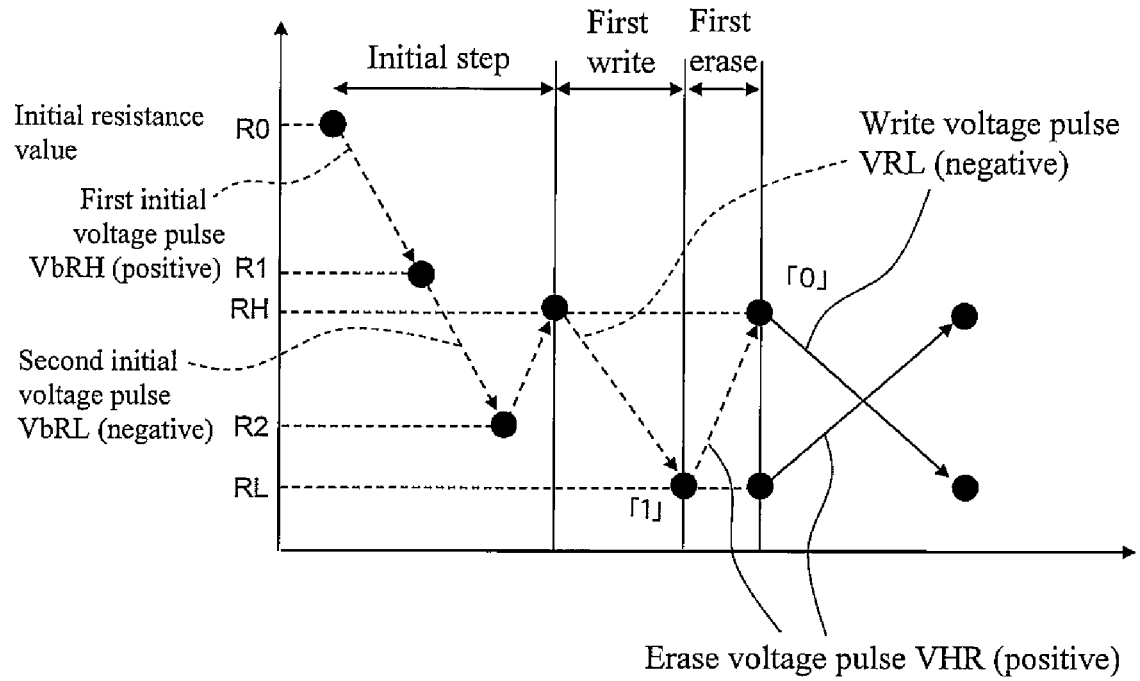

IbRH : Maximum value of current flowing through metal oxide layer when first initial voltage pulse VbRH is applied IbRL : Maximum value of current flowing through metal oxide layer when second initial voltage pulse VbLR is applied IRL : Maximum value of current flowing through metal oxide layer when write voltage pulse VLR is applied IRH : Maximum value of current flowing through metal oxide layer when erase voltage pulse VHR is applied $$|IbRH| > |IRL| > |IbRL|$$
$$\text{and} \quad |IbRH| > |IRH|$$

Fig. 4A

IbRL : Maximum value of current flowing through metal oxide layer when second initial voltage pulse VbLR is applied IRL : Maximum value of current flowing through metal oxide layer when write voltage pulse VLR is applied IRH : Maximum value of current flowing through metal oxide layer when erase voltage pulse VHR is applied $|IRL| > |IbRL|$ Initial step Higher-resistance state attaining break : VbRH=+3.3V, IbRH=450 μA
Lower-resistance state attaining break  : VbRL=−1.8V, IbRL=−150 μA
Higher-resistance state attaining up    : VRH=+2.4V, IRH=180 μA

| VRL (V) | IRL (μA) | VRH (V) | IRH (μA) | Initial stage | After 1E5 cycles |
|---|---|---|---|---|---|
| −1.4 | −75 | 2 | 100 | × | × |
| −1.6 | −110 | 2.2 | 120 | × | × |
| −1.8 | −150 | 2.4 | 180 | ○ | × |
| −1.9 | −170 | 2.5 | 210 | ○ | × |
| −2 | −190 | 2.6 | 250 | ○ | ○ |
| −2.1 | −210 | 2.7 | 280 | ○ | ○ |
| −2.2 | −230 | 2.8 | 310 | ○ | ○ |
| −2.3 | −250 | 2.9 | 330 | ○ | ○ |
| −2.4 | −275 | 3 | 350 | ○ | ○ |

○ : RL variation rate ≦5%
× : RL variation rate >5%

Initial step

Higher-resistance state attaining break : VbRH=+3.3V, IbRH=450 $\mu$ A
Lower-resistance state attaining break : VbRL=−1.8V, IbRL=−150 $\mu$ A
Higher-resistance state attaining up : VRH=+2.4V, IRH=180 $\mu$ A Initial step Higher-resistance state attaining break : VbRH=+3.3V, IbRH=450 μA
Lower-resistance state attaining break : VbRL=−2.4V, IbRL=−270 μA
Higher-resistance state attaining up : VHR=3.0V, IHR=300 μA

| VRL (V) | IRL (μA) | VRH (V) | IRH (μA) | Initial stage | After 1E5 cycles |
|---|---|---|---|---|---|
| −1.4 | −75 | 2 | 100 | × | × |
| −1.6 | −110 | 2.2 | 120 | × | × |
| −1.8 | −150 | 2.4 | 180 | × | × |
| −2 | −190 | 2.6 | 250 | × | × |
| −2.2 | −230 | 2.8 | 310 | × | × |
| −2.4 | −275 | 3 | 350 | ○ | × |
| −2.5 | −300 | 3.1 | 370 | ○ | × |
| −2.6 | −330 | 3.2 | 390 | ○ | ○ |
| −2.7 | −360 | 3.3 | 410 | ○ | ○ |

○ : RL variation rate ≦5%
× : RL variation rate >5%

Fig. 11

Initial step
  Higher-resistance state attaining break : VbRH=+3.3V
  Lower-resistance state attaining break : VbRL=−1.8V
  Higher-resistance state attaining up   : VRH=+2.4V

| VRL (V) | VRH (V) | Initial stage | After 1E5 cycles |
|---|---|---|---|
| −1.4 | 2 | × | × |
| −1.6 | 2.2 | × | × |
| −1.8 | 2.4 | ○ | × |
| −1.9 | 2.5 | ○ | × |
| −2 | 2.6 | ○ | ○ |
| −2.1 | 2.7 | ○ | ○ |
| −2.2 | 2.8 | ○ | ○ |
| −2.3 | 2.9 | ○ | ○ |
| −2.4 | 3 | ○ | ○ |

○ : RL variation rate ≦5%
× : RL variation rate >5%

Initial step

Higher-resistance state attaining break : VbRH=+3.3V
Lower-resistance state attaining break : VbRL=−2.4V
Higher-resistance state attaining up     : VHR=3.0V

| VRL (V) | VRH (V) | Initial stage | After 1E5 cycles |
|---|---|---|---|
| −1.4 | 2 | × | × |
| −1.6 | 2.2 | × | × |
| −1.8 | 2.4 | × | × |
| −2 | 2.6 | × | × |
| −2.2 | 2.8 | × | × |
| −2.4 | 3 | ○ | × |
| −2.5 | 3.1 | ○ | × |
| −2.6 | 3.2 | ○ | ○ |
| −2.7 | 3.3 | ○ | ○ |

○ : RL variation rate ≦5%
× : RL variation rate >5%

Fig. 18

DRIVING METHOD OF VARIABLE RESISTANCE ELEMENT AND NON-VOLATILE MEMORY DEVICE

RELATED APPLICATIONS

This application is the U.S. National Phase under 35 U.S.C. §371 of International Application No. PCT/JP2012/007912, filed on Dec. 11, 2012, which in turn claims the benefit of Japanese Application No. 2011-271894, filed on Dec. 13, 2011, and Japanese Application No. 2011-271900, filed on Dec. 13, 2011, the disclosures of which Applications are incorporated by reference herein.

TECHNICAL FIELD

The present invention relates to a driving method of a variable resistance element which changes its resistance value in response to an electric pulse applied thereto, and a non-volatile memory device which implements this method.

BACKGROUND ART

With recent advancement of digital technologies in electronic devices, there has been increasing demands for an increase in a capacity of a non-volatile variable resistance element, a reduction in write electric power of the non-volatile variable resistance element, a reduction in write/read time of the non-volatile variable resistance element, and a longer life of the non-volatile variable resistance element, for storing data such as images. Under the circumstances in which there are such demands, it is said that there is a limitation on miniaturization of an existing flash memory using a floating gate.

As a first prior art which has a potential of meeting the above-mentioned demands, there has been proposed a non-volatile variable resistance element comprising a perovskite material (e.g., $Pr_{(1-x)}Ca_xMnO_3$ [PCMO], $LaSrMnO_3$ [LSMO], $GdBaCo_xO_y$ [GBCO], or the like) (see Patent Literature 1). In this technique, voltage pulses (wave-shaped voltages each having a short duration) which are different in polarity are applied to the perovskite material to increase or decrease its resistance value, and data are made to correspond to the changed resistance value, thereby storing the data.

As a second prior art which makes it possible to switch the resistance value using voltage pulses with the same polarity, there has also been proposed a non-volatile variable resistance element which utilizes a phenomenon in which a resistance value of a layer comprising transition metal oxide (NiO, $V_2O$, ZnO, $Nb_2O_5$, $TiO_2$, $WO_3$, or CoO) changes by applying voltage pulses which are different in pulse width to this transition metal oxide layer (see Patent Literature 2). In conjunction with a variable resistance element using the transition metal oxide layer, a configuration in which cross-point memory arrays incorporating diodes are stacked together is put into practice.

CITATION LIST

Patent Literature

Patent Literature 1: U.S. Pat. No. 6,204,139 specification
Patent Literature 2: Japanese Laid-Open Patent Application Publication No. 2004-363604

SUMMARY OF INVENTION

Technical Problem

However, to attain desired stability, there has been a need for further improvement of stability for the variable resistance element and the driving method thereof in the conventional examples.

The present invention has been developed under the above stated circumstances, and a primary object is to provide a driving method of a variable resistance element which enables the variable resistance element to stably change its resistance, and a non-volatile memory device which implements the driving method.

Solution to Problem

To achieve the above mentioned objective, according to an aspect of the present invention, there is provided a method of driving a variable resistance element including a first electrode, a second electrode, and a metal oxide layer which is provided between the first electrode and the second electrode and changes its resistance value in response to a voltage pulse applied between the first electrode and the second electrode, wherein the metal oxide layer has a first oxide region connected to the first electrode, and a second oxide region connected to the second electrode and having a higher oxygen content atomic percentage than the first oxide region, the method comprising the steps of: applying a write voltage pulse of a first polarity between the first electrode and the second electrode to change a resistance state of the metal oxide layer from a higher-resistance state to a lower-resistance state to place the metal oxide layer in a write state; applying an erase voltage pulse of a second polarity which is different from the first polarity between the first electrode and the second electrode to change the resistance state of the metal oxide layer from the lower-resistance state to the higher-resistance state to place the metal oxide layer in an erase state; and before a first write step is performed, applying an initial voltage pulse of the first polarity between the first electrode and the second electrode to change the resistance value of the metal oxide layer from a resistance value corresponding to an initial state of the metal oxide layer to another resistance value; wherein when the resistance value corresponding to the initial state of the metal oxide layer is R0, the resistance value corresponding to the write state is RL, the resistance value corresponding to the erase state is RH, the another resistance value is R2, a maximum value of a current flowing through the metal oxide layer when the initial voltage pulse is applied is IbRL, a maximum value of the current flowing through the metal oxide layer when the write voltage pulse is applied is IRL, and a maximum value of the current flowing through the metal oxide layer when the erase voltage pulse is applied is IRH, $R0>RH>R2 \geq RL$, and $|IRL|>|IbRL|$ are satisfied.

According to an aspect of the present invention, there is provided a method of driving a variable resistance element including a first electrode, a second electrode, and a metal oxide layer which is provided between the first electrode and the second electrode and changes its resistance value in response to a voltage pulse applied between the first electrode and the second electrode, wherein the metal oxide layer has a first oxide region connected to the first electrode, and a second oxide region connected to the second electrode and having a higher oxygen content atomic percentage than the first oxide region, the method comprising the steps of: applying a write voltage pulse of a first polarity between the first electrode and the second electrode to change a resistance state of the metal oxide layer from a higher-resistance state to a lower-resistance state to place the metal oxide layer in a write state; applying an erase voltage pulse of a second polarity which is different from the first polarity between the first electrode and the second electrode to change the resistance state of the metal oxide layer from the lower-resistance state to the higher-resistance state to place the metal oxide layer in an erase state; and before a first write step is performed, applying a first initial voltage pulse of the second polarity between the first electrode and the second electrode to change the resistance value of the metal oxide layer from a resistance value corresponding to an initial state of the metal oxide layer to a first resistance value, and then applying a second initial voltage pulse of the first polarity between the first electrode and the second electrode to change the resistance value of the metal oxide layer from the first resistance value to a second resistance value; wherein when the resistance value corresponding to the initial state of the metal oxide layer is R0, the resistance value corresponding to the write state is RL, the resistance value corresponding to the erase state is RH, the first resistance value is R1, the second resistance value is R2, a maximum value of a current flowing through the metal oxide layer when the first initial voltage pulse is applied is IbRH, a maximum value of the current flowing through the metal oxide layer when the second initial voltage pulse is applied is IbRL, a maximum value of the current flowing through the metal oxide layer when the write voltage pulse is applied is IRL, and a maximum value of the current flowing through the metal oxide layer when the erase voltage pulse is applied is IRH, R0>R1≥RH>R2≥RL, and |IbRH|>|IRL|>|IbRL| and |IbRH|>|IRH| are satisfied.

Advantageous Effects of Invention

In accordance with a driving method of a variable resistance element of the present invention, the variable resistance element is allowed to change its resistance stably. In accordance with a non-volatile memory device of the present invention, which implements the driving method, it becomes possible to implement a memory device which is stably operative.

BRIEF DESCRIPTION OF DRAWINGS

FIG. 4A is a view showing a change in a resistance value of a metal oxide layer of the variable resistance element of Embodiment 1, in a case where data is written to the variable resistance element (write step), a case where data is erased from the variable resistance element (erase step), and in an initial step performed with respect to the variable resistance element before first write is performed.

FIG. 11 is a table showing evaluation of the resistance variation rate.

FIG. 18 is a view showing evaluation of the resistance variation rate.

DESCRIPTION OF EMBODIMENTS

Figure 1:
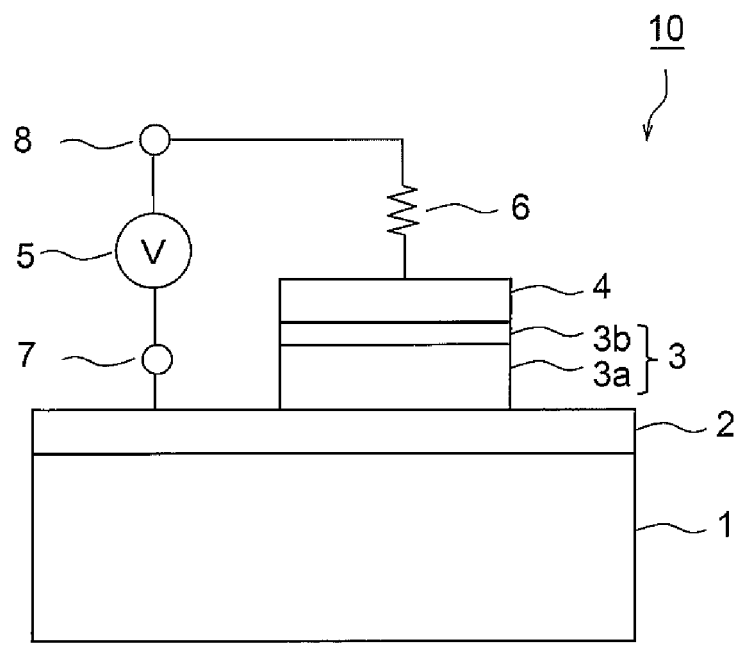
FIG. 1 is a schematic view showing an exemplary configuration of a variable resistance element of Embodiment 1.

The present inventors intensively studied to improve stability of a variable resistance element. As a result, the present inventors discovered that a variation in resistance of the variable resistance element could be suppressed by performing setting such that an absolute value of a current flowing through a metal oxide layer when a write voltage pulse is applied is equal to or greater than an absolute value of a current flowing through the metal oxide layer when an initial voltage pulse is applied to enable the variable resistance element to attain a lower-resistance state. In addition, the present inventors discovered that the variation in the resistance of the variable resistance element could be suppressed by performing setting such that an absolute value of the initial voltage pulse applied to enable the variable resistance element to attain the lower-resistance state is greater than an absolute value of a voltage value of the write voltage pulse. Hereinafter, this finding will be suitably described in detail in conjunction with embodiments.

Hereinafter, the embodiments will be described with reference to the drawings. The embodiments described below are merely examples. Numeric values, shapes, materials, elements, layout positions and connection forms of the elements, steps, an order of the steps, etc., which are described in the embodiments below, are merely exemplary, and are not intended to limit the present invention. The present invention is limited only by the claims. Therefore, among the elements of the embodiments described below, the elements which are not recited in independent claims which indicate broadest concepts of the present invention are not always necessary for the solution to the problem, but will be described as configuring possible embodiments.

(Embodiment 1)

According to Embodiment 1, there is provided a method of driving a variable resistance element including a first electrode, a second electrode, and a metal oxide layer which is provided between the first electrode and the second electrode and changes its resistance value in response to a voltage pulse applied between the first electrode and the second electrode, wherein the metal oxide layer has a first oxide region connected to the first electrode, and a second oxide region connected to the second electrode and having a higher oxygen content atomic percentage than the first oxide region, the method comprising the steps of: applying a write voltage pulse of a first polarity between the first electrode and the second electrode to change a resistance state of the metal oxide layer from a higher-resistance state to a lower-resistance state to place the metal oxide layer in a write state; applying an erase voltage pulse of a second polarity which is different from the first polarity between the first electrode and the second electrode to change the resistance state of the metal oxide layer from the lower-resistance state to the higher-resistance state to place the metal oxide layer in an erase state; and before a first write step is performed, applying an initial voltage pulse of the first polarity between the first electrode and the second electrode to change the resistance value of the metal oxide layer from a resistance value corresponding to an initial state of the metal oxide layer to another resistance value; wherein when the resistance value corresponding to the initial state of the metal oxide layer is $R0$, the resistance value corresponding to the write state is $RL$, the resistance value corresponding to the erase state is $RH$, the another resistance value is $R2$, a maximum value of a current flowing through the metal oxide layer when the initial voltage pulse is applied is $IbRL$, a maximum value of the current flowing through the metal oxide layer when the write voltage pulse is applied is $IRL$, and a maximum value of the current flowing through the metal oxide layer when the erase voltage pulse is applied is $IRH$, $R0 > RH > R2 \geq RL$, and $|IRL| > |IbRL|$ are satisfied.

According to Embodiment 1, there is provided a method of driving a variable resistance element including a first electrode, a second electrode, and a metal oxide layer which is provided between the first electrode and the second electrode and changes its resistance value in response to a voltage pulse applied between the first electrode and the second electrode, wherein the metal oxide layer has a first oxide region connected to the first electrode, and a second oxide region connected to the second electrode and having a higher oxygen content atomic percentage than the first oxide region, the method comprising the steps of: applying a write voltage pulse of a first polarity between the first electrode and the second electrode to change a resistance state of the metal oxide layer from a higher-resistance state to a lower-resistance state to place the metal oxide layer in a write state; applying an erase voltage pulse of a second polarity which is different from the first polarity between the first electrode and the second electrode to change the resistance state of the metal oxide layer from the lower-resistance state to the higher-resistance state to place the metal oxide layer in an erase state; and before a first write step is performed, applying a first initial voltage pulse of the second polarity between the first electrode and the second electrode to change the resistance value of the metal oxide layer from a resistance value corresponding to an initial state of the metal oxide layer to a first resistance value, and then applying a second initial voltage pulse of the first polarity between the first electrode and the second electrode to change the resistance value of the metal oxide layer from the first resistance value to a second resistance value; wherein when the resistance value corresponding to the initial state of the metal oxide layer is $R0$, the resistance value corresponding to the write state is $RL$, the resistance value corresponding to the erase state is $RH$, the first resistance value is $R1$, the second resistance value is $R2$, a maximum value of a current flowing through the metal oxide layer when the first initial voltage pulse is applied is $IbRH$, a maximum value of the current flowing through the metal oxide layer when the second initial voltage pulse is applied is $IbRL$, a maximum value of the current flowing through the metal oxide layer when the write voltage pulse is applied is $IRL$, and a maximum value of the current flowing through the metal oxide layer when the erase voltage pulse is applied is $IRH$, $R0 > R1 \geq RH > R2 \geq RL$, and $|IbRH| > |IRL| > |IbRL|$ and $|IbRH| > |IRH|$ are satisfied.

In the above driving method, the maximum value $IRL$ of the current flowing through the metal oxide layer when the write voltage pulse is applied may satisfy a relationship of $|IRL| > |IbRL| \times 1.18$.

In the above driving method, the metal oxide layer may comprise one of a tantalum oxide, a hafnium oxide, and a zirconium oxide.

In the above driving method, the first oxide region may contain an oxide having a composition expressed as $TaO_x$ ($0.8 \leq x \leq 1.9$), and the second oxide region may contain an oxide having a composition expressed as $TaO_y$ ($2.1 \leq y \leq 2.5$).

In the above driving method, the maximum value of the current flowing through the metal oxide layer when the write voltage pulse is applied may be increased to be greater in a present write step after the write step has been performed in repetition, than in previous write steps.

The above driving method may further comprise the step of: verifying the resistance state of the metal oxide after the write step and re-performing the write step when it is determined that the write state has not been implemented, as a result of the verification, wherein the maximum value of the current flowing through the metal oxide when the write voltage pulse is applied may be increased to be greater in a present write step after the verifying step has been performed plural times, than in previous write steps.

According to Embodiment 1, there is provided a non-volatile memory device comprising: a variable resistance element including a first electrode, a second electrode, and a metal oxide layer which is provided between the first electrode and the second electrode and changes its resistance value in response to a voltage pulse applied between the first electrode and the second electrode; and a voltage pulse application circuit for applying a predetermined voltage pulse to the variable resistance element; wherein the metal oxide layer has a first oxide region connected to the first electrode, and a second oxide region connected to the second electrode and having a higher oxygen content atomic percentage than the first oxide region; wherein the voltage pulse application circuit applies a write voltage pulse of a first polarity between the first electrode and the second electrode to change a resistance state of the metal oxide layer from a higher-resistance state to a lower-resistance state to place the metal oxide layer in a write state; wherein the voltage pulse application circuit applies an erase voltage pulse of a second polarity which is different from the first polarity between the first electrode and the second electrode to change the resistance state of the metal oxide layer from the lower-resistance state to the higher-resistance state to place the metal oxide layer in an erase state; wherein before a first write step is performed, the voltage pulse application circuit applies an initial voltage pulse of the first polarity between the first electrode and the second electrode to change the resistance value of the metal oxide layer from a resistance value corresponding to an initial state of the metal oxide layer to another resistance value; and wherein when the resistance value corresponding to the initial state of the metal oxide layer is R0, the resistance value corresponding to the write state is RL, the resistance value corresponding to the erase state is RH, the another resistance value is R2, a maximum value of a current flowing through the metal oxide layer when the initial voltage pulse is applied is IbRL, a maximum value of the current flowing through the metal oxide layer when the write voltage pulse is applied is IRL, and a maximum value of the current flowing through the metal oxide layer when the erase voltage pulse is applied is IRH, R0>RH>R2≥RL, and |IRL|>|IbRL| are satisfied.

According to Embodiment 1, there is provided a non-volatile memory device comprising: a variable resistance element including a first electrode, a second electrode, and a metal oxide layer which is provided between the first electrode and the second electrode and changes its resistance value in response to a voltage pulse applied between the first electrode and the second electrode; and a voltage pulse application circuit for applying a predetermined voltage pulse to the variable resistance element; wherein the metal oxide layer has a first oxide region connected to the first electrode, and a second oxide region connected to the second electrode and having a higher oxygen content atomic percentage than the first oxide region; wherein the voltage pulse application circuit applies a write voltage pulse of a first polarity between the first electrode and the second electrode to change a resistance state of the metal oxide layer from a higher-resistance state to a lower-resistance state to place the metal oxide layer in a write state; wherein the voltage pulse application circuit applies an erase voltage pulse of a second polarity which is different from the first polarity between the first electrode and the second electrode to change the resistance state of the metal oxide layer from the lower-resistance state to the higher-resistance state to place the metal oxide layer in an erase state; wherein before a first write step is performed, the voltage pulse application circuit applies a first initial voltage pulse of the second polarity between the first electrode and the second electrode to change the resistance value of the metal oxide layer from a resistance value corresponding to an initial state of the metal oxide layer to a first resistance value, and then applies a second initial voltage pulse of the first polarity between the first electrode and the second electrode to change the resistance value of the metal oxide layer from the first resistance value to a second resistance value; wherein when the resistance value corresponding to the initial state of the metal oxide layer is R0, the resistance value corresponding to the write state is RL, the resistance value corresponding to the erase state is RH, the first resistance value is R1, the second resistance value is R2, a maximum value of a current flowing through the metal oxide layer when the first initial voltage pulse is applied is IbRH, a maximum value of the current flowing through the metal oxide layer when the second initial voltage pulse is applied is IbRL, a maximum value of the current flowing through the metal oxide layer when the write voltage pulse is applied is IRL, and a maximum value of the current flowing through the metal oxide layer when the erase voltage pulse is applied is IRH, R0 >R1≥RH>R2≥RL, and |IbRH|>|IRL|>|IbRL| and |IbRH|>|IRH| are satisfied.

In the above non-volatile memory device, the maximum value IRL of the current flowing through the metal oxide layer when the write voltage pulse is applied may satisfy a relationship of |IRL|>|IbRL|×1.18.

In the above non-volatile memory device, the metal oxide layer may comprise one of a tantalum oxide, a hafnium oxide, and a zirconium oxide.

In the above non-volatile memory device, the first oxide region may contain an oxide having a composition expressed as $TaO_x$ (0.8≤x≤1.9); and the second oxide region may contain an oxide having a composition expressed as $TaO_y$ (2.1≤y≤2.5).

In the above non-volatile memory device, the voltage pulse application circuit may be configured to apply the write voltage pulse such that the current of a magnitude greater than a maximum value of the current flowing through the metal oxide layer when the write voltage pulse has been applied in repetition is flowed, in a case where the voltage pulse application circuit applies the write voltage pulse after the voltage pulse application circuit has applied the write voltage pulse in repetition.

The above non-volatile memory device may further comprise a verification means which verifies the resistance state of the metal oxide layer after the write voltage pulse is applied; wherein the voltage pulse application circuit is configured to re-apply the write voltage pulse when the verification means determines that the write state has not been implemented, as a result of the verification; and wherein the voltage pulse application circuit may be configured to apply the write voltage pulse such that the current of a magnitude greater than a maximum value of the current flowing through the metal oxide layer when the write voltage pulse has been re-applied plural times is flowed, in a case where the voltage pulse application circuit applies the write voltage pulse after the voltage pulse application circuit has re-applied the write voltage pulse plural times.

The above non-volatile memory device may further comprise a current steering element electrically connected to the first electrode or the second electrode. In this case, the current steering element may be a transistor or a diode.

[Configuration of Variable Resistance Element]

First of all, an exemplary configuration of the variable resistance element of Embodiment 1 will be described.

FIG. 1 is a schematic view showing the exemplary configuration of the variable resistance element of Embodiment 1. As shown in FIG. 1, a variable resistance element 10 of the present embodiment includes a substrate 1, a first electrode 2 formed on and above the substrate 1, a metal oxide layer 3 formed on and above the first electrode 2, and a second electrode 4 formed on and above the metal oxide layer 3. The first electrode 2 and the second electrode 4 are electrically connected to the metal oxide layer 3.

The first electrode 2 may be substantially equal in size to the second electrode 4. The electrodes 2 and 4, and the metal oxide layer 3 may be reversed in vertical layout position, or laid out such that they are placed horizontally.

The substrate 1 comprises, for example, a silicon substrate provided with circuit elements such as transistors. Each of the first electrode 2 and the second electrode 4 comprises one or a plurality of materials selected from, for example, Au (gold), Pt (platinum), Ir (iridium), Cu (copper), W (tungsten), and TaN (tantalum nitride).

The metal oxide layer 3 is configured to include a first tantalum oxide layer 3a and a second tantalum oxide layer 3b which are stacked together. The second tantalum oxide layer 3b is higher in oxygen content atomic percentage than the first tantalum oxide layer 3a.

It is sufficient that when a composition of the first tantalum oxide layer 3a is expressed as $TaO_x$, $0<x<2.5$ is satisfied, while when a composition of the second tantalum oxide layer 3b is expressed as $TaO_y$, $x<y$ is satisfied. When $0.8 \le x \le 1.9$ and $2.1 \le y \le 2.5$ were satisfied, the resistance value of the metal oxide layer 3 could stably change at a high speed. Therefore, x and y may fall within the above ranges.

The metal oxide layer 3 may have a thickness which is equal to or less than 200 nm, although it is observed that the resistance value changes so long as it is equal to or less than 1 μm. With this configuration, the metal oxide layer 3 is easily processed when photolithography and etching are used as patterning process, and a voltage value of a voltage pulse required to change the resistance value of the metal oxide layer 3 can be decreased. On the other hand, to more surely avoid breakdown (insulation breakdown) during application of the voltage pulse, the metal oxide layer 3 may have a thickness which is equal to or more than at least 5 nm.

The second tantalum oxide layer 3b may have a thickness which is approximately equal to or greater than 1 nm and approximately equal to or less than 8 nm, to reduce a possibility that an initial resistance value will become great excessively and to attain stable resistance change.

In a case where the variable resistance element 10 configured as described above is operated, the first electrode 2 and the second electrode 4 are electrically connected to different terminals of an electric power supply 5. Alternatively, the variable resistance element 10 may be electrically connected to the electric power supply 5 via a protective resistor 6. The electric power supply 5 is configured to apply to the variable resistance element 10 an electric pulse (voltage pulse) having a predetermined polarity, a predetermined voltage and a predetermined duration as an electric pulse application device for driving the variable resistance element 10. The protective resistor 6 serves to prevent breakdown of the variable resistance element which would be caused by an excess current. In Embodiment 1, the resistance value of the protective resistor 6 is, for example, 4.5 kΩ. The voltage pulse is applied between a first terminal 7 and a second terminal 8.

Hereinafter, it is assumed that the voltage of the voltage pulse applied between the terminals is specified by an electric potential of the second terminal 8 on the basis of the first terminal 7. In this case, a polarity of a current flowing when a positive voltage is applied to the second terminal 8 is positive.

[Manufacturing Method of Variable Resistance Element]

Next, an exemplary manufacturing method of the variable resistance element 10 will be described.

Initially, on the substrate 1, by sputtering, the first electrode 2 which is 0.2 μm in thickness is deposited. Thereafter, by reactive sputtering in which sputtering is conducted in atmosphere of an argon gas and an oxygen gas using a Ta target, a tantalum oxide layer is deposited on the first electrode 2. An oxygen content atomic percentage of the tantalum oxide layer can be adjusted easily by changing a flow ratio of the oxygen gas with respect to the argon gas. A substrate temperature may be a room temperature without particularly heating the substrate.

Next, an uppermost surface of the tantalum oxide layer deposited as described above is oxidized to reform the surface. Or, using a tantalum oxide (e.g., $Ta_2O_5$) target having an oxygen content atomic percentage of a high concentration, a layer which is higher in oxygen content atomic percentage is deposited by sputtering. Thus, a region (second region) which is higher in oxygen content atomic percentage than a region (first region) in which the tantalum oxide layer remains non-oxidized is deposited on the surface of the tantalum oxide layer deposited earlier.

The first region and the second region correspond to the first tantalum oxide layer 3a and the second tantalum oxide layer 3b, respectively. The metal oxide layer 3 includes the first tantalum oxide layer 3a and the second tantalum oxide layer 3b which are formed as described above.

Then, on the metal oxide layer 3 formed as described above, the second electrode 4 which is 0.2 μm in thickness is deposited by sputtering, thereby obtaining the variable resistance element 10.

The size and shape of each of the first electrode 2 and the second electrode 4, and the metal oxide layer 3, can be adjusted by photo mask and photolithography. In the present embodiment, the size of the second electrode 4 and the metal oxide layer 3 is 0.5 μm×0.5 μm (area: 0.25 μm$^2$), and the size of a portion of the first electrode 2 and a portion of the metal oxide layer 3, which portions are in contact with each other, is also 0.5 μm×0.5 μm (area: 0.25 μm$^2$).

In the present embodiment, the first tantalum oxide layer 3a has a composition of $TaO_x$ (x=1.54) and the second tantalum oxide layer 3b has a composition of $TaO_y$ (y=2.47). The metal oxide layer 3 has a thickness of 50 nm, the first tantalum oxide layer 3a has a thickness of 45 nm, and the second tantalum oxide layer 3b has a thickness of 5 nm.

Although in the present embodiment, x=1.54 and y=2.47 as described above, the values of x and y are not limited to these. The values of x and y may be such that $0.8 \le x \le 1.9$ and $2.1 \le y \le 2.5$. In this configuration, like a resistance changing characteristic of the present embodiment, stable resistance change can be implemented.

[Operation of Variable Resistance Element]

Next, an operation of the variable resistance element 10 manufactured by the above mentioned manufacturing method will be described.

Hereinafter, a state in which the resistance value of the metal oxide layer 3 is a predetermined greater value (e.g., 300 kΩ) will be referred to as a higher-resistance state, while a state in which the resistance value of the metal oxide layer 3 is a predetermined smaller value (e.g., 12 kΩ) will be referred to as a lower-resistance state.

The electric power supply 5 applies a write voltage pulse which is a negative voltage pulse between the first terminal 7 and the second terminal 8, thereby causing the resistance value of the metal oxide layer 3 to decrease and hence the metal oxide layer 3 to change from the higher-resistance state to the lower-resistance state. Hereinafter, this will be referred to as a write step.

By comparison, the electric power supply 5 applies an erase voltage pulse which is a positive voltage pulse between the first terminal 7 and the second terminal 8, thereby causing the resistance value of the metal oxide layer 3 to increase, and hence the metal oxide layer 3 to change from the lower-resistance state to the higher-resistance state. Hereinafter, this will be referred to as an erase step.

Even when a negative voltage pulse which has the same polarity as that of the write voltage pulse is applied between the first terminal 7 and the second terminal 8 in the state in which the metal oxide layer 3 is in the lower-resistance state, the metal oxide layer 3 remains in the lower-resistance state and does not change its resistance state. Likewise, even when a positive voltage pulse which has the same polarity as that of the erase voltage pulse is applied between the first terminal 7 and the second terminal 8 in the state in which the metal oxide layer 3 is in the higher-resistance state, the metal oxide layer 3 remains in the higher-resistance state and does not change its resistance state. However, when the resistance value of the metal oxide layer 3 is an initial resistance value (value greater than the resistance value corresponding to the "higher-resistance state"), the resistance value decreases by applying, between the two terminals, a positive voltage pulse which has the same polarity as that of the erase voltage pulse, as will be described later.

By repeating the above stated write step and erase step, the variable resistance element 10 operates. Note that overwrite is performed in some cases, in which the same write step or the same erase step is performed successively.

In the present embodiment, the initial step is performed prior to the first write step. The initial step refers to a step which enables a stable resistance changing operation to occur in the write step and the erase step performed thereafter. The variable resistance element 10 just after manufacturing has an initial resistance value greater than that corresponding to the higher-resistance state in normal resistance change. In this state, even if the write voltage pulse or the erase voltage pulse in a normal operation is applied to the variable resistance element 10, the resistance change does not occur. In this initial step, two kinds of initial voltage pulses which are a first initial voltage pulse (higher-resistance state attaining break) which is a positive voltage pulse and a second initial voltage pulse (lower-resistance state attaining break) which is a negative voltage pulse, are applied in this order between the first terminal 7 and the second terminal 8. When the first initial voltage pulse is applied between the first terminal 7 and the second terminal 8, the resistance value of the metal oxide layer 3 decreases from the initial resistance value to a first resistance value. Then, when the second initial voltage pulse is applied between the first terminal 7 and the second terminal 8, the resistance value of the metal oxide layer 3 further decreases from the first resistance value to a second resistance value. Thereafter, by applying the write voltage pulse or the erase voltage pulse in the normal operation, the variable resistance element 10 causes the resistance change. In general, the initial step is performed with respect to the variable resistance element 10 in an initial state which is not applied with a voltage yet after the variable resistance element 10 is manufactured.

In the present embodiment, when a voltage value of the first initial voltage pulse in the higher-resistance state attaining break is VbRH, a maximum value of the current flowing through the metal oxide layer when the first initial voltage pulse is applied is IbRH, a voltage value of the second initial voltage pulse in the lower-resistance state attaining break is VbRL, a maximum value of the current flowing through the metal oxide layer when the second initial voltage pulse is applied is IbLR, a voltage value of the write voltage pulse in the write step (lower-resistance state attaining process) is VRL, a maximum value of the current flowing through the metal oxide layer when the write voltage pulse is applied is ILR, a voltage value of the erase voltage pulse in the erase step (higher-resistance state attaining process) is VRH, and a maximum value of the current flowing through the metal oxide layer when the erase voltage pulse is applied is IHR, a relationship of |IbRH|>|IRL|>|IbRL| and |IbRH|>|IRH| is satisfied. By satisfying this relationship, a stable resistance changing operation can be implemented as will be described later.

Figure 2:
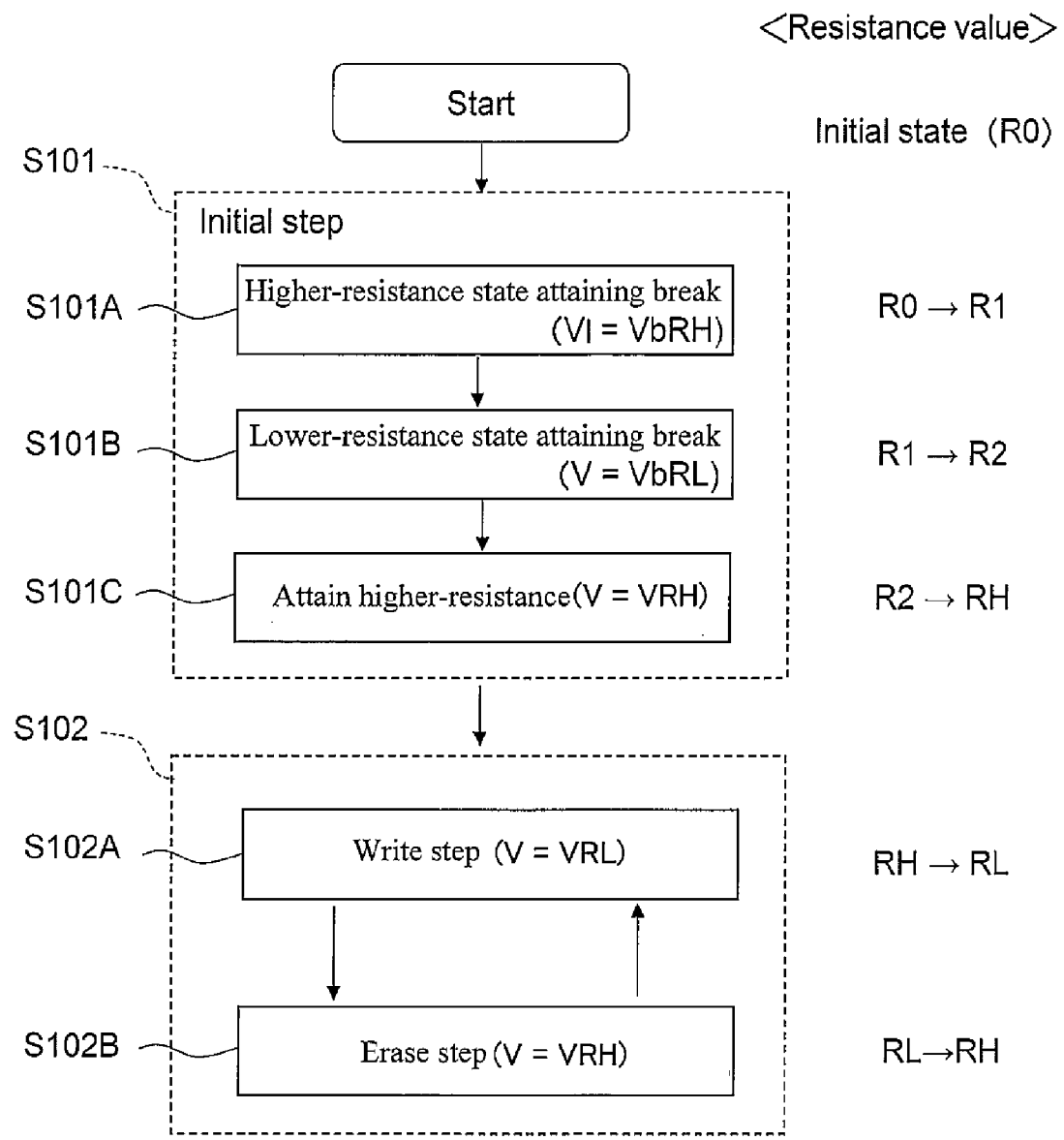
FIG. 2 is a flowchart showing an operation of the variable resistance element of Embodiment 1.

FIG. 2 shows a flowchart showing the operation of the variable resistance element 10 of Embodiment 1 as described above. When the resistance value of the metal oxide layer 3 is an initial resistance value R0, i.e., prior to a first write step is performed, the initial step is performed (S101). In this initial step, firstly, the first initial voltage pulse of the voltage value VbRH is applied between the first terminal 7 and the second terminal 8 (S101A). This causes the resistance value of the metal oxide layer 3 to decrease from the initial resistance value R0 to a first resistance value R1. Hereinafter, the processing in step S101A will be referred to as "higher-resistance state attaining break process." The higher-resistance state attaining break process may be considered as processing in which a core of a filament is formed within the metal oxide layer 3, and thus, formation of the filament which occurs thereafter is facilitated. Then, the second initial voltage pulse of the voltage value VbRL is applied between the first terminal 7 and the second terminal 8 (S101B). This causes the resistance value of the metal oxide layer 3 to further decrease from the first resistance value R1 to a second resistance value R2. Hereinafter, the processing in step S101B will be referred to as "lower-resistance state attaining break process." The lower-resistance state attaining break process may be considered as processing for forming a filament having conductive paths within the metal oxide layer 3. Then, a higher-resistance state attaining voltage pulse (although the higher-resistance state attaining voltage pulse is, for example, a voltage value VRH, in the present embodiment, a voltage which is a little higher than VHR may be applied) is applied between the first terminal 7 and the second terminal 8 (S101C). This causes the resistance value of the metal oxide layer 3 to increase from the second resistance value R2 to a higher-resistance value RH. Hereinafter, the processing in step S101C will be referred to as "higher-resistance state attaining process." The higher-resistance state attaining process is processing in which the oxygen concentration within the filament is increased to increase the resistance value, thereby changing the resistance value of the metal oxide layer 3 into the higher-resistance value RH (erased state).

After the above mentioned initial step finishes, step S102 is performed, in which the write step and the erase step are repeated. Specifically, a write step using the write voltage pulse of the voltage value VRL (S102A) and an erase step using the erase voltage pulse of the voltage value VRH (S102B) are repeated. When step 102A is performed, the resistance value of the metal oxide layer 3 changes from the higher-resistance value RH to the lower-resistance value RL. When step 102B is performed, the resistance value of the metal oxide layer 3 changes from the lower-resistance value RL to the higher-resistance value RH.

The initial resistance value R0, the first resistance value R1, the second resistance value R2, the higher-resistance value RH, and the lower-resistance value RL as described above satisfy a relationship of R0>R1≥RH>R2≥RL. That is, in the initial step, the resistance value of the metal oxide layer 3 changes from the initial resistance value R0 to the first resistance value R1 which is equal to or greater than the higher-resistance value RH. Then, the resistance value of the metal oxide layer 3 changes from the first resistance value R1 to the second resistance value R2 which is smaller than the higher-resistance value RH and equal to or greater than the lower-resistance value RL.

Figure 3:
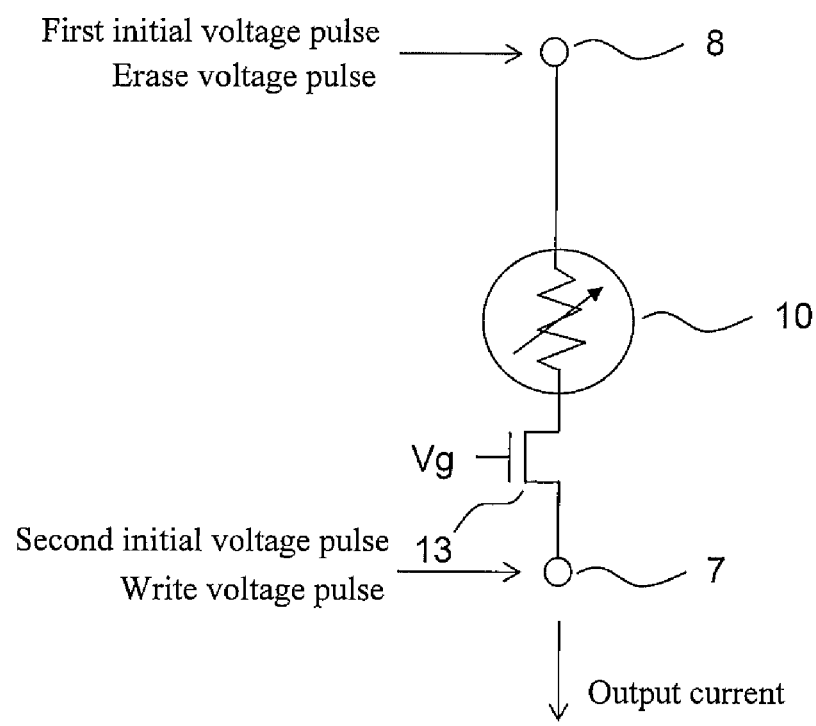
FIG. 3 is a view showing an exemplary configuration of a circuit for operating the variable resistance element of Embodiment 1 and an exemplary operation in a case where data is written to the variable resistance element.

FIG. 3 is a view showing an exemplary configuration of a circuit for operating the variable resistance element 10 of Embodiment 1 and an exemplary operation in a case where data is written to the variable resistance element 10. As shown in FIG. 3, this circuit includes the variable resistance element 10, the second terminal 8 and the first terminal 7. The second electrode 4 of the variable resistance element 10 is electrically connected to the second terminal 8, while the first electrode 2 of the variable resistance element 10 is electrically connected to the first terminal 7. A transistor 13 is provided between the first electrode 2 of the variable resistance element 10 and the first terminal 7. This transistor serves as a switching element for selecting a resistive element and a protective resistor. A gate voltage Vg is applied to the transistor 13, and hence a predetermined voltage pulse is supplied to the variable resistance element 10 via the transistor 13.

FIG. 4A is a view showing a change in the resistance value of the metal oxide layer 3 of the variable resistance element 10 of Embodiment 1, in a case where data is written to the variable resistance element 10 (write step), a case where data is erased from the variable resistance element 10 (erase step), and in the initial step performed with respect to the variable resistance element 10 before first write step is performed. In the write step, the erase step and the initial step, as shown in FIG. 4A, when the positive voltage pulse is applied, a predetermined positive voltage pulse is supplied to the second terminal 8 on the basis of the first terminal 7, while when the negative voltage pulse is applied, a predetermined positive voltage pulse is supplied to the first terminal 7 on the basis of the second terminal 8.

When a positive first initial voltage pulse (voltage value VbRH) is supplied between the second terminal 8 and the first terminal 7 in a case where the variable resistance element 10 is in the initial state (the resistance value of the metal oxide layer 3 is the initial resistance value R0), the resistance value of the metal oxide layer 3 decreases from the initial resistance value R0 to the first resistance value R1 (higher-resistance state attaining break process), as shown in FIG. 4A. The maximum value of the current flowing through the metal oxide layer in this higher-resistance state attaining break process is IbRH. Then, when a negative second initial voltage pulse (voltage value VbRL) is supplied between the second terminal 8 and the first terminal 7, the resistance value of the metal oxide layer 3 further decreases from the first resistance value R1 to the second resistance value R2 (lower-resistance state attaining break process). The maximum value of the current flowing through the metal oxide layer in this lower-resistance state attaining break process is IbLH. Then, when a positive erase voltage pulse (voltage value VRH) is supplied between the second terminal 8 and the first terminal 7, the resistance value of the metal oxide layer 3 increases from the second resistance value R2 to the higher-resistance value RH (higher-resistance state attaining process). Through the above operation, the initial step finishes.

After the above stated initial step finishes, when the negative write voltage pulse (voltage value VRL) is supplied between the second terminal 8 and the first terminal 7, the resistance value of the metal oxide layer 3 decreases from the higher-resistance value RH to the lower-resistance value RL as shown in FIG. 4A (first write). Thus, 1-bit data representing "1" is written to the variable resistance element 10. The maximum value of the current flowing through the metal oxide layer during this write is ILR. Then, when the positive erase voltage pulse (voltage value VRH) is supplied between the second terminal 8 and the first terminal 7, the resistance value of the metal oxide layer 3 increases from the lower-resistance value RL to the higher-resistance value RH (first erase). Thus, 1-bit data representing "0" is written to the variable resistance element 10. The maximum value of the current flowing through the metal oxide layer during this erase is IRH.

Since the resistance value of the metal oxide layer 3 is such that the initial resistance value R0 is greatest and the higher-resistance value RH is greater than the lower-resistance value RL, a relationship of R0>RH>RL is satisfied. Since in the present embodiment, the first resistance value R1 in the initial step is equal to or greater than the higher-resistance value RH, and the second resistance value R2 in the initial step is equal to or greater than the lower-resistance value RL, a relationship of R0>R1≥RH>R2≥RL is satisfied.

When the negative write voltage pulse (voltage value VRL) is supplied to the second terminal 8 in a case where the resistance value of the metal oxide layer 3 is the higher-resistance value RH, the resistance value of the metal oxide layer 3 changes from the higher-resistance value RH to the lower-resistance value RL. On the other hand, when the positive erase voltage pulse (voltage value VRH) is supplied to the second terminal 8 in a case where the resistance value of the metal oxide layer 3 is the lower-resistance value RL, the resistance value of the metal oxide layer 3 changes from the lower-resistance value RL to the higher-resistance value RH.

In this circuit, also, by supplying the voltage pulses to the second terminal 8 such that the relationship of |IbRH|>|IRL|>|IbRL| and |IbRH|>|IRH| is satisfied as described above, the variable resistance element 10 is allowed to serve as a memory which is stably operative at a high speed.

Figure 5:
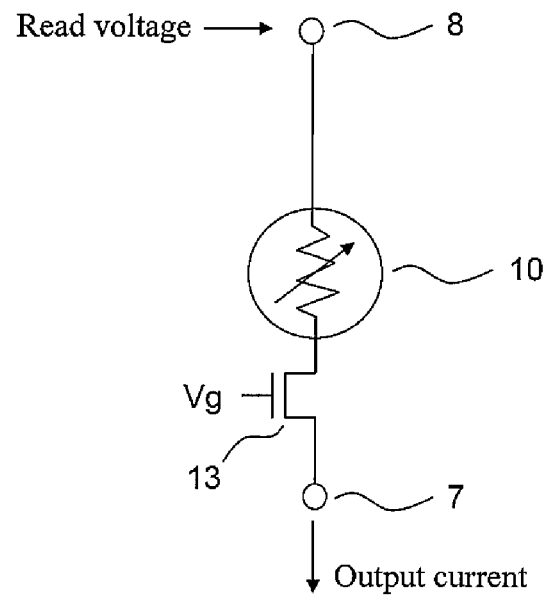
FIG. 5 is a view showing an exemplary configuration of the circuit for operating the variable resistance element of Embodiment 1 and an exemplary operation in a case where data written to the variable resistance element is read from the variable resistance element.

FIG. 5 is a view showing an exemplary configuration of the circuit for operating the variable resistance element 10 of Embodiment 1 and an exemplary operation in a case where data written to the variable resistance element 10 is read from the variable resistance element 10. As shown in FIG. 5, when the data is read from the variable resistance element 10, a read voltage is supplied to the second terminal 8 on the basis of the first terminal 7. This read voltage has a value which does not cause resistance change in the variable resistance element 10 supplied with the read voltage, and is specified on the basis of the first electrode 2 and a ground point.

Figure 6:
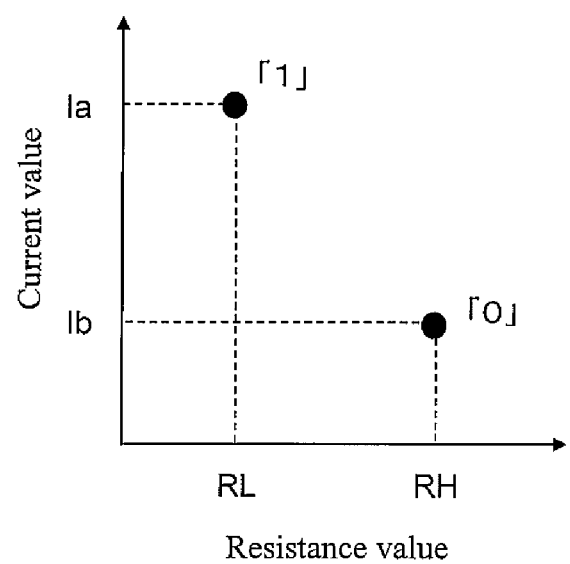
FIG. 6 is a view showing a relationship between a current value of a current flowing through a circuit including the variable resistance element of Embodiment 1 and the resistance value of the metal oxide layer, in a case where data is read.

FIG. 6 is a view showing a relationship between a current value of the current flowing through the circuit including the variable resistance element 10 of Embodiment 1 and the resistance value of the metal oxide layer 3, in a case where data is read. When the read voltage is supplied to the second terminal 8, the current corresponding to the resistance value of the metal oxide layer 3 flows through the circuit. That is, as shown in FIG. 6, when the resistance value of the metal oxide layer 3 is the lower-resistance value RL, a current of a current value Ia flows through the circuit, while when the resistance value of the metal oxide layer 3 is the higher-resistance value RH, a current of a current value Ib flows through the circuit.

As shown in FIG. 5, in a case where the first terminal 7 is grounded and the read voltage is supplied to the second terminal 8, a current value of the current flowing between the second terminal 8 and the first terminal 7 is detected, to determine whether the resistance value of the metal oxide layer 3 is the higher-resistance value RH or the lower-resistance value RL. Specifically, when the detected current value is Ia, it is determined that the resistance value of the metal oxide layer 3 is the lower-resistance value RL. From this, it can be found that the data written to the variable resistance element 10 is "1". In contrast, when the detected current value is Ib, it is determined that the resistance value of the metal oxide layer 3 is the higher-resistance value RH. From this, it can be found that the data written to the variable resistance element 10 is "0". In the above described manner, the data written to the variable resistance element 10 is read.

The variable resistance element 10 of the present embodiment does not change its resistance value even after a power is turned OFF. Therefore, by using the variable resistance element 10, a non-volatile memory device can be implemented.

Figure 7:
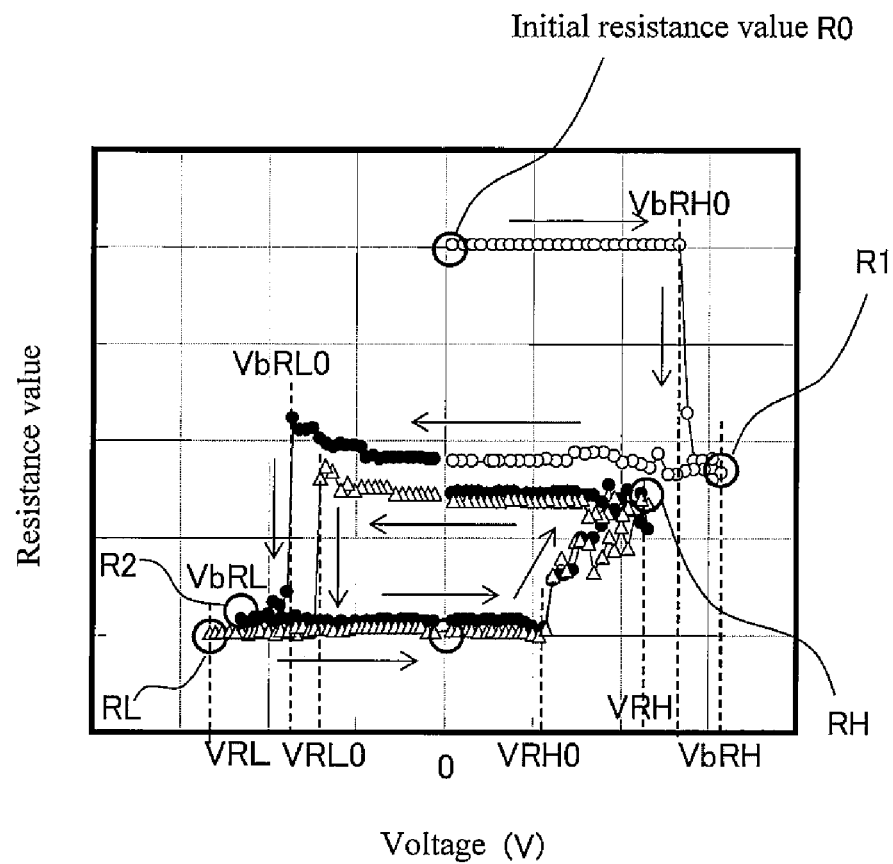
FIG. 7 is a graph showing a change in the resistance value of the metal oxide layer, in a case where a voltage value of a voltage pulse applied to the variable resistance element of Embodiment 1 is changed.

FIG. 7 is a graph showing an exemplary change in the resistance value of the metal oxide layer 3, in a case where the voltage value of the voltage pulse applied to the variable resistance element 10 of Embodiment 1 of FIG. 1 via the protective resistor 6 is changed.

As indicated by "○" in FIG. 7, for a period during which the voltage value of the voltage pulse is changing from 0 to VbRH, the resistance value of the metal oxide layer 3 is maintained at the initial resistance value R0. When the voltage value reaches VbRH0, the resistance value decreases drastically and becomes the first resistance value R1 when the voltage value is VbRH. It is estimated that the decrease in the resistance value from R0 to R1 is due to formation of the core of the filament having the conductive paths within the metal oxide layer 3. Then, the resistance value of the metal oxide layer 3 is maintained at approximately R1 even when the voltage value of the voltage pulse is decreased from VbRH to 0V.

Then, as indicated by "●" in FIG. 7, for a period during which the voltage value of the voltage pulse is changing from 0 to VbRL0, the resistance value of the metal oxide layer 3 is maintained at a value close to the first resistance value R1. When the voltage value reaches VbRL0, the resistance value decreases drastically and becomes the second resistance value R2 when the voltage value is VbRL0. It is estimated that the decrease in the resistance value from R1 to R2 is due to formation of the filament having the conductive paths within the metal oxide layer 3.

Then, for a period during which the voltage value of the voltage pulse is changing to VRH0, the resistance value of the metal oxide layer 3 is maintained at a value close to the second resistance value R2. When the voltage value reaches VRH0, the resistance value increases drastically and becomes the higher-resistance value RH when the voltage value is VRH. It is estimated that the increase in the resistance value from R2 to RH is due to a phenomenon in which the oxygen concentration of the filament within the metal oxide layer 3 increases and thereby the conductive paths decrease in number. Then, for a period during which the voltage value of the voltage pulse is changing to about 0, the resistance value of the metal oxide layer 3 is maintained at a value close to the higher-resistance value RH.

As indicated by "Δ" in FIG. 7, for a period during which the voltage value of the voltage pulse is changing from 0 to VRL0, the resistance value of the metal oxide layer 3 is maintained at a value close to the higher-resistance value RH. When the voltage value reaches VRL0, the resistance value decreases drastically and is substantially maintained at the lower-resistance value RL for a period during which the voltage value is changing to VRL. Then, for a period during which the voltage value of the voltage pulse is changing to VRH0, the resistance value of the metal oxide layer 3 is maintained at a value close to the lower-resistance value RL. When the voltage value reaches VRH0, the resistance value increases drastically and becomes the higher-resistance value RH when the voltage value is VRH. Thereafter, a state in which the resistance value of the metal oxide layer 3 is the lower-resistance value RL and a state in which the resistance value of the metal oxide layer 3 is the higher-resistance value RH are repeated.

In the present embodiment, the first initial voltage pulse (voltage value VbRH) is applied to the variable resistance element 10 to change the resistance value of the metal oxide layer 3 to the first resistance value R1 of FIG. 7, the second initial voltage pulse (voltage value VbRL) is applied to the variable resistance element 10 to change the resistance value of the metal oxide layer 3 to the second resistance value R2 of FIG. 7, the erase voltage pulse (voltage value VRH) is applied to the variable resistance element 10 to change the resistance value of the metal oxide layer 3 to the higher-resistance value RH of FIG. 7, and the write voltage pulse (voltage value VRL) is applied to the variable resistance element 10 to change the resistance value of the metal oxide layer 3 to the lower-resistance value RL of FIG. 7.

In this case, when a maximum value (current value corresponding to the resistance value R1) of the current flowing through the metal oxide layer when the first initial voltage pulse is applied is IbRH, a maximum value (current value corresponding to the resistance value R2) of the current flowing through the metal oxide layer when the second initial voltage pulse is applied is IbLR, a maximum value (current value corresponding to the resistance value RH) of the current flowing through the metal oxide layer when the erase voltage pulse is applied is IHR, and a maximum value (current value corresponding to the resistance value RL) of the current flowing through the metal oxide layer when the write voltage pulse is applied is ILR, these maximum values of the current flowing through the metal oxide layer are set to satisfy the relationship of |IbRH|>|IRL|>|IbRL| and |IbRH|>|IRH|. Hereinafter, a description will be given of the fact that a more stable resistance changing operation can be implemented when this relationship is satisfied.

[Relationship Among Voltage Values of Voltage Pulses]

In a case where data is written to a variable resistance element using a write voltage pulse or an erase voltage pulse after a resistance changing operation of the variable resistance element is repeated a considerable number of times, a resistance value of the variable resistance element after the data is written thereto is in some cases deviated from a value initially set as a higher-resistance value or a lower-resistance value. Hereinafter, this phenomenon will be referred to as "variation of the resistance value." The degree of the variation of the resistance value can be expressed as a resistance variation rate as will be described next.

Figure 8:
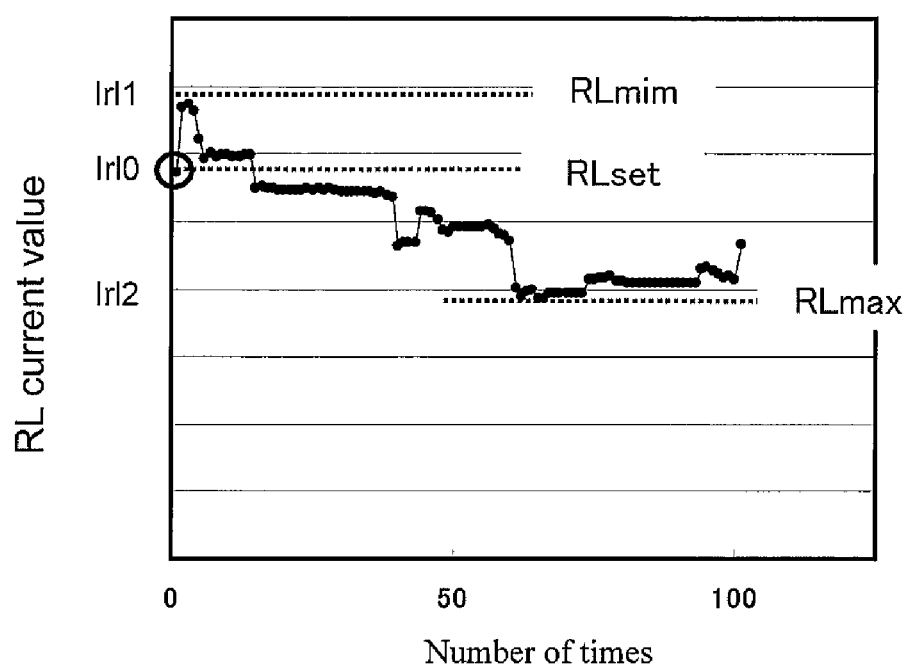
FIG. 8 is a graph for explaining a concept of a resistance variation rate.

FIG. 8 is a graph showing a concept of the resistance variation rate. This graph shows a change of a current value detected when a read voltage is applied to the variable resistance element changed to the lower-resistance state by application of the write voltage pulse. A vertical axis indicates the current value and a horizontal axis indicates the number of times the resistance value is read.

The above case is such that data is read plural times successively after the data is written once. In addition to this, when a set of one write and one read is repeated plural times, the read resistance value may be in some cases deviated from the set value. The degree of deviation (magnitude of variation) of the resistance value in this case is similar to that in the case where the data is read plural times successively after data is written once.

In FIG. 8, RLset indicates the resistance value (i.e., resistance value of the variable resistance element after first write is performed) of the variable resistance element which is initially set as the lower-resistance value RL, and a current value detected when the RLset is read is indicated by Irl0. RLmax indicates a maximum resistance value in the case where the variable resistance element is in the lower-resistance state, and a current value detected when RLmax is read is indicated by Irl2. RLmin indicates a minimum resistance value in the case where the variable resistance element is in the lower-resistance state, and a current value detected when RLmin is read is indicated by Irl1. Using these values RLset, RLmax and RLmin, the resistance variation rate (RL variation rate) corresponding to the lower-resistance state is represented by the following formula 1:

$$RL\text{variation rate}(\%) = (RL\max - RL\min)/RL\text{set} \times 100 \quad \text{formula 1}$$

The resistance variation rate corresponding to the higher-resistance state can be defined as in the case of the above stated RL variation rate.

Next, a description will be given of a relationship among the maximum value of the current flowing through the metal oxide layer when the first initial voltage pulse is applied, the maximum value of the current flowing through the metal oxide layer when the second initial voltage pulse is applied, the maximum value of the current flowing through the metal oxide layer when the write voltage pulse is applied, and the maximum value of the current flowing through the metal oxide layer when the erase voltage pulse is applied, in conjunction with the RL variation rate.

Figures 9A, 9B:
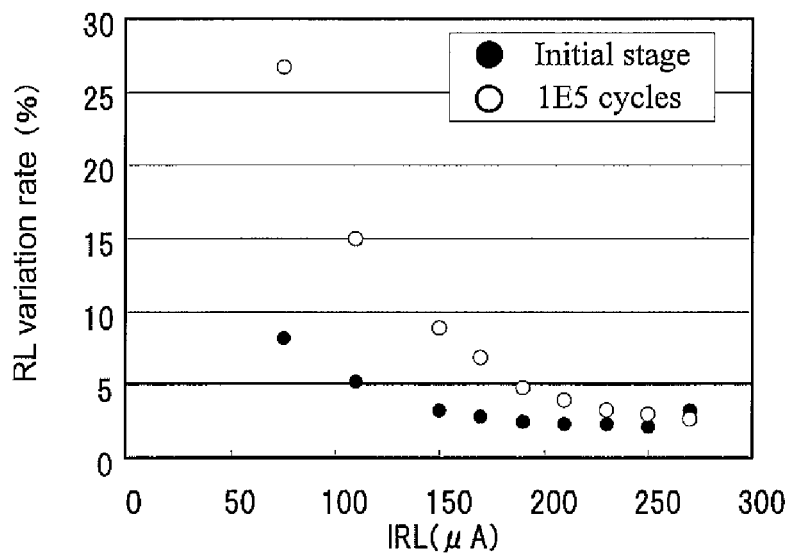
FIG. 9A is a table showing evaluation of the resistance variation rate.
FIG. 9B is a graph showing evaluation of the resistance variation rate.

FIGS. 9A and 9B are views showing results of evaluation of the RL variation rates under driving conditions in which the maximum values (IRL and IRH) of the currents flowing through the metal oxide layer during write and during erase are changed, by changing the write voltage pulse (VRL) and the erase voltage pulse (VRLH), regarding the variable resistance element which has gone through the higher-resistance state attaining break process using VbRH=+3.3V (IbRH=450 μA), the lower-resistance state attaining break process using VbRL=−1.8V (IbRL=−150 μA), and the higher-resistance state attaining process using VRH=+2.4V (IRH=180 μA), in the initial step. In FIG. 9A, reference symbol "○" indicates that the RL variation rate is equal to or less than 5%, while reference symbol "X" indicates that the RL variation rate is greater than 5%. In columns of "initial stage" in FIG. 9A, results of the evaluation of the RL variation rates from 0-th write to 100-th write are represented, while in columns of "after 1E5 cycles" in FIG. 9A, results of evaluation from $10^5$-th write to ($10^5$+100)-th write are represented. The term "1E5 cycles" refers to $10^5$ cycles.

As shown in FIG. 9A, in the initial stage, the variation rates are "X" only in the case of IRL=−75 μA and IRL=−110 μA and are "○" in the cases where an absolute value of IRL is greater than in the above cases. After the 1E5 cycles, the variation rates are "X" in the case of IRL=−150 μA and IRL=−170 μA (=1.13×IbRL) in addition to the case of IRL=−75 μA and IRL=−110 μA. FIG. 9B is a graph showing the above results as a relationship between VRL and the RL variation rate.

Figure 10A:
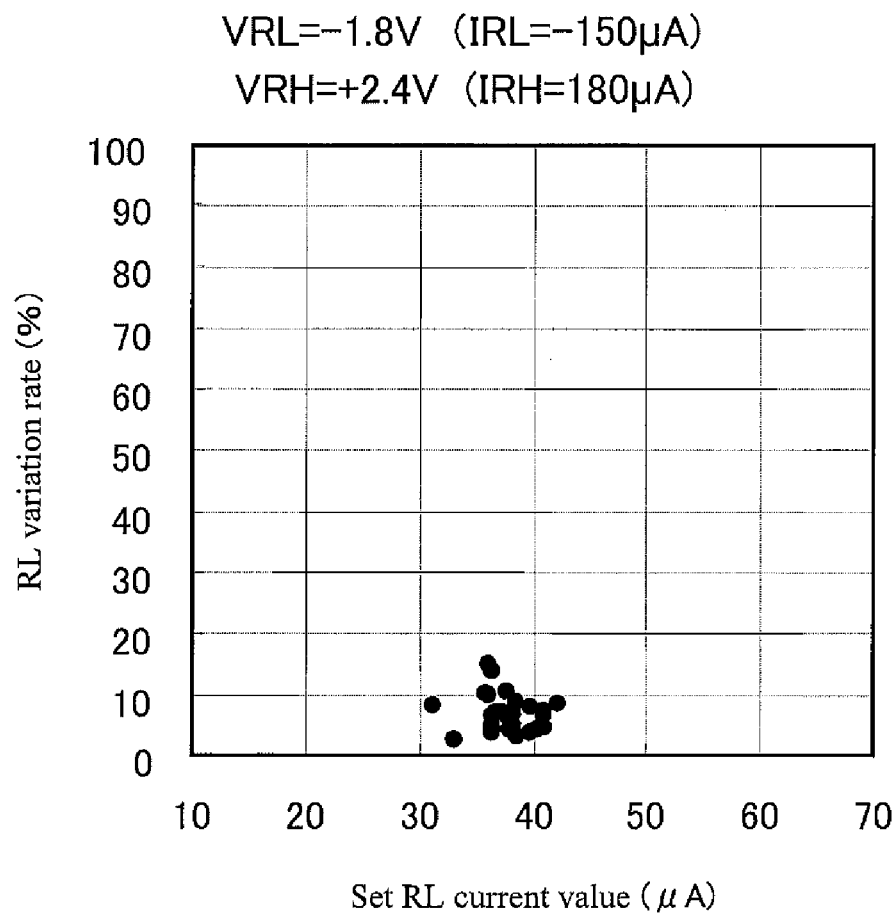
FIG. 10A is a graph showing a relationship between the resistance variation rate and a set RL current value.
Figure 10B:
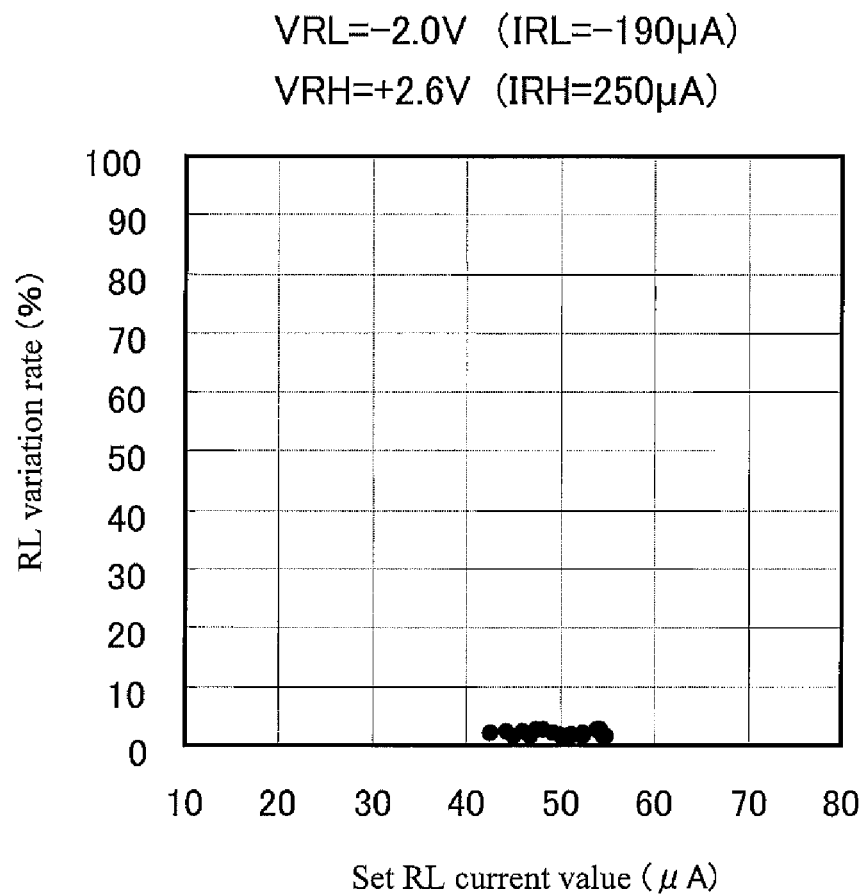
FIG. 10B is a graph showing a relationship between the resistance variation rate and the set RL current value.

FIG. 10A is a graph showing a relationship between the RL variation rate and a set RL current value in the case of VRL=−1.8V (IRL=−150 μA). FIG. 10B is a graph showing a relationship between the RL variation rate and the set RL current value in the case of VLR=−2.0V (IRL=−190 μA). The set RL current value indicates a read current value in a case where data is written to elements of 25 bits. The voltage values of the voltage pulses in the initial step are similar to those of FIGS. 9A and 9B.

As shown in FIG. 10A, in the case of VRL=−1.8V (IRL=−150 μA), the RL variation rates are great values in almost all set RL current values, including a case where, for example, the RL variation rate exceeds 10% in a certain set RL current value. By comparison, as shown in FIG. 10B, in the case of VLR=−2.0V (IRL=−190 μA), the RL variation rates are small values which are equal to or less than 5% in all set RL current values.

From FIGS. 9A, 9B, 10A and 10B, it is confirmed that, to implement a stable resistance changing operation, |IRL|>150 μA is required in the case of |IbRL|=150 μA. In addition, it is confirmed that, to implement a stable resistance changing operation in cases where the number of times of write increases, a variation among bits is considered, etc., |IRL|≥190 μA=(|1.27×IbRL|) may be set in the case of |IbRL|=150 μA.

FIG. 11 is a view showing results of evaluation of the RL variation rates under driving conditions in which the maximum values (IRL and IRH) of the currents flowing through the metal oxide layer during write and during erase are changed, by changing the write voltage pulse (VRL) and the erase voltage pulse (VRLH), regarding the variable resistance element which has gone through the higher-resistance state attaining break process using VbRH=+3.3V (IbRH=450 μA), the lower-resistance state attaining break process using VbRL=−2.4V (IbRL=−270 μA), and the higher-resistance state attaining process using VRH=+3.0V (IHR=300 μA), in the initial step. As shown in FIG. 11, in the initial stage, the variation rates are "X" from VRL=−1.4V (IRL=−75 μA) to VRL=−2.2V (IRL=−230 μA), and are "○" in the cases where an absolute value of VRL is greater than in the above cases. By comparison, after the 1E5 cycles, the variation rates are "X" from VRL=−1.4V (IRL=−75 μA) to VRL=−2.5V (IRL=−300 μA=1.11×IbRL), and are "○" in the case where VRL is equal to or greater than VRL=−2.6V (ILR=−330 μA=1.22×IbRL). From these experiment results and additional experiment results, it was found that to implement a stable resistance changing operation in cases where the number of times of write increases, a variation among bits is considered, etc., the variation rates are "○" in the case where the absolute value of ILR is greater than |IbRL|×1.18 (=median value between 1.13 and 1.22).

From the above, it can be seen that a stable resistance changing operation is implemented when a relationship of |IRL|>|IbRL| is satisfied. It can also be seen that to implement a stable resistance changing operation in cases where the number of times of write increases, a variation among bits is considered, etc., a relationship of |IRL|≥|IbRL|×1.18 may be satisfied.

A mechanism which causes the above relationships may be as follows. A size of a region (filament) in which resistance change occurs depends on a break voltage. That is, when the break voltage is greater, a filament diameter increases, while when the break voltage is smaller, the filament diameter decreases. The filament has defectives. When a voltage is applied to the variable resistance element after the break, oxygen migrates into and out of the defectives, thereby causing the resistance value to change. In a case where the filament diameter is equal, the density of the defectives occurring in the filament is lower in the lower-resistance state and is higher in the higher-resistance state, if the voltage applied to the variable resistance element to cause the resistance change after the break is smaller. In the lower-resistance state, the defectives are aligned to form conductive paths and the resistance value decreases. If the density of the defectives is low, a few defectives disappear and hence non-existence of the conductive paths tends to occur, which causes the resistance to increase. It is predicted that such a mechanism is attributed to the variation in the resistance value corresponding to the lower-resistance state. In a case where the filament diameter is equal, as the voltage applied to cause the resistance change after the break is greater, the density of the defectives generated in the filament is higher in the lower-resistance state, the non-existence of the conductive paths is less likely to occur even when a few defectives disappear, and hence the resistance value corresponding to the lower-resistance state does not change easily. Therefore, by setting the voltage applied to cause the resistance change greater than the break voltage, a possibility that the resistance value is varied can be lessened.

According to Patent Literature 3 (International Publication NO. 2010/038442), Patent Literature 4 (International Publication NO. 2010/021134), Patent Literature 5 (Japanese Laid-Open Patent Application Publication NO. 2011-233211), etc., it is well-known that the variable resistance element cannot be changed to the higher-resistance state unless the voltage which is greater in absolute value than the voltage for attaining the lower-resistance state is applied thereto. That is, the absolute value of the voltage for attaining the higher-resistance state (erase voltage: VRH) varies depending on the voltage for attaining the lower-resistance state (write voltage: VRL). Therefore, if the conditions are set based on the absolute value of VRL, VRH may be decided depending on VRL.

The maximum value (IRH) of the current flowing through the metal oxide when the erase voltage pulse is applied is a current value at a time point when the variable resistance element initiates changing of its resistance state from the lower-resistance state to the higher-resistance state, or a current value after the variable resistance element has changed to the higher-resistance state. Which of these values becomes the maximum value is different depending on a magnitude of the erase voltage. The current value at the time point when the variable resistance element initiates changing of its resistance state from the lower-resistance state to the higher-resistance state, is equal to or a little greater than IRL. The current value after the variable resistance element has changed to the higher-resistance state is a value of the current flowing during application of the erase voltage. As should be well-known, a current-voltage characteristic (I-V characteristic) of the element is generally non-linear. An erase voltage is greater than a read voltage. Because of this, a current of a relatively great magnitude may flow through the element even in the higher-resistance state, by application of the erase voltage. According to the above mentioned review, if $|VRH|>|VRL|$, then $|IRH|\geq|IRL|$ is satisfied. Therefore, if the conditions are set based on the absolute value of IRL, IRH may be decided depending on IRL.

In Embodiment 1, in the case of $|IRL|\geq|IbRH|$, a failure may occur, in which the variable resistance element does not easily change to the higher-resistance state, and the RH current value is unstable. In addition, in the case of $|IRH|\geq|IbRH|$, a failure may occur, in which the variable resistance element does not easily change to the lower-resistance state, and the LR current value is unstable. Therefore, when a relationship of $|IbRH|>|IRL|>|IbRL|$ and $|IbRH|>|IRH|$ is satisfied, a stable resistance changing operation can be implemented. Furthermore, when a relationship of $|IbRH|>|IRL|>|IbRL|\times 1.18$ and $|IbRH|>|IRH|$ is satisfied, a stable resistance changing operation can be implemented in cases where the number of times of write increases, a variation among bits is considered, etc.

[Modified Operation 1]

In Embodiment 1, an example is described in which in the initial step before the first write step, the two kinds of initial voltage pulses which are the first initial voltage pulse (higher-resistance state attaining break) which is the positive voltage pulse and the second initial voltage pulse which is the negative voltage pulse (lower-resistance state attaining break) are applied in this order between the first terminal 7 and the second terminal 8. In the present modified operation, for example, in a case where the second tantalum oxide layer 3b is thin, the positive voltage pulse is not applied but the negative voltage pulse is applied as the initial voltage pulse in the initial step (lower-resistance state attaining break process). Alternatively, in the initial step, the higher-resistance state attaining process may be performed after a negative initial voltage pulse is applied. In that case, when the voltage value of the initial voltage pulse is VbRL, the maximum value of the current flowing through the metal oxide layer when the initial voltage pulse is applied is IbLR, the voltage value of the write voltage pulse in the write step (lower-resistance state attaining process) is VRL, and the maximum value of the current flowing through the metal oxide layer when the write voltage pulse is applied is ILR, a relationship of $|IRL|>|IbRL|$ may be satisfied. By satisfying this relationship, the stable resistance changing operation can be implemented. In the modified operation 1, a process for applying the positive voltage pulse (higher-resistance state attaining break) may be omitted. This can simplify the initial step.

Figure 4B:
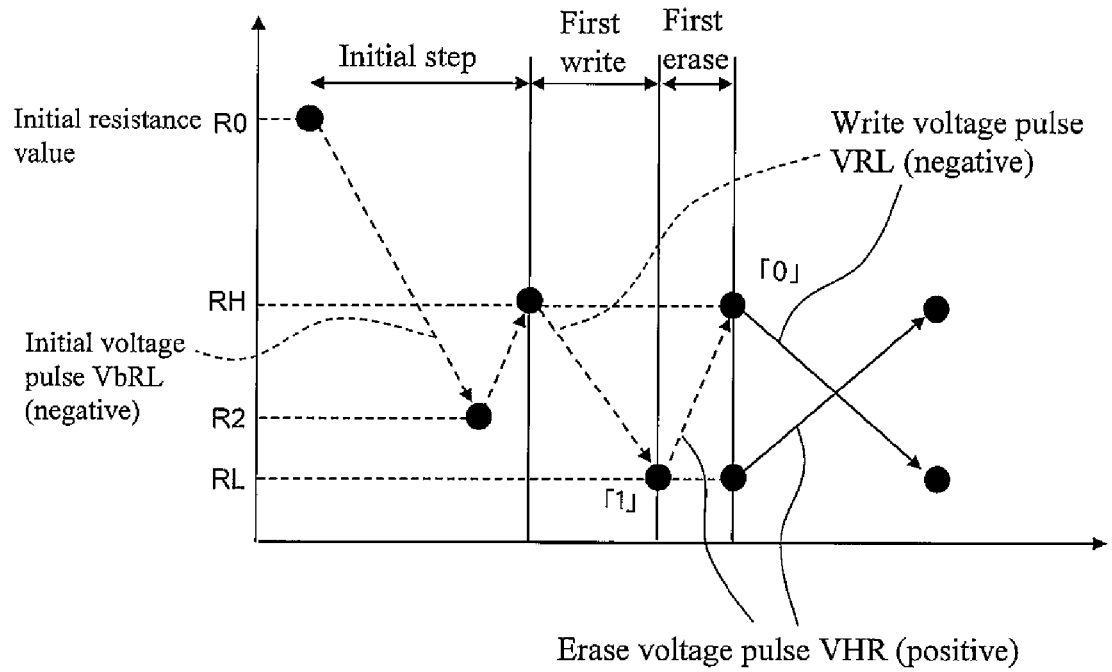
FIG. 4B is a view showing a change in the resistance value of the metal oxide layer of the variable resistance element in modified operation 1 of Embodiment 1, in a case where data is written to the variable resistance element (write step), a case where data is erased from the variable resistance element (erase step), and in the initial step performed with respect to the variable resistance element before the first write is performed.

FIG. 4B is a view showing a change in the resistance value of the metal oxide layer 3 in the variable resistance element 10 in modified operation 1 of Embodiment 1, in a case where data is written to the variable resistance element 10 (write step), a case where data is erased from the variable resistance element 10 (erase step), and in the initial step performed with respect to the variable resistance element 10 before first write step is performed. In the write step, the erase step, and the initial step, as shown in FIG. 4B, during application of the positive voltage pulse, a predetermined positive voltage pulse is supplied to the second terminal 8 on the basis of the first terminal 7, while during application of the negative voltage pulse, a predetermined positive voltage pulse is supplied to the first terminal 7 on the basis of the second terminal 8.

When a negative initial voltage pulse (voltage value VbRL) is supplied between the second terminal 8 and the first terminal 7 in a case where the variable resistance element 10 is in the initial state (the resistance value of the metal oxide layer 3 is the initial resistance value R0), the resistance value of the metal oxide layer 3 further decreases from the initial resistance value R0 to another resistance value (hereinafter referred to as second resistance value) R2, as shown in FIG. 4B ("lower-resistance state attaining break process"). The maximum value of the current flowing through the metal oxide layer in this lower-resistance state attaining break process is IbRL. Then, when a positive erase voltage pulse (voltage value VRH) is applied between the second terminal 8 and the first terminal 7, the resistance value of the metal oxide layer 3 increases from the second resistance value R2 to the higher-resistance value RH (higher-resistance state attaining process). Through the above, the initial step finishes.

After the above stated initial step finishes, when the negative write voltage pulse (voltage value VRL) is supplied between the second terminal 8 and the first terminal 7, the resistance value of the metal oxide layer 3 decreases from the higher-resistance value RH to the lower-resistance value RL as shown in FIG. 4B (first write). Thus, 1-bit data representing "1" is written to the variable resistance element 10. The maximum value of the current flowing through the metal oxide layer during this write is ILR. Then, when the positive erase voltage pulse (voltage value VRH) is supplied between the second terminal 8 and the first terminal 7, the resistance value of the metal oxide layer 3 increases from the lower-resistance value RL to the higher-resistance value RH (first erase). Thus, 1-bit data representing "0" is written to the variable resistance element 10. The maximum value of the current flowing through the metal oxide layer during this erase is IRH.

Since the resistance value of the metal oxide layer 3 is such that the initial resistance value R0 is greatest and the higher-resistance value RH is greater than the lower-resistance value RL, a relationship of R0>RH>RL is satisfied. Since in the present embodiment, the second resistance value R2 is equal to or greater than the lower-resistance value RL, a relationship of R0>RH>R2≥RL is satisfied.

When a negative write voltage pulse (voltage value VRL) is supplied to the second terminal 8 in a case where the resistance value of the metal oxide layer 3 is the higher-resistance value RH, the resistance value of the metal oxide layer 3 changes from the higher-resistance value RH to the lower-resistance value RL. On the other hand, when a positive erase voltage pulse (voltage value VRH) is supplied to the second terminal 8 in a case where the resistance value of the metal oxide layer 3 is the lower-resistance value RL, the resistance value of the metal oxide layer 3 changes from the lower-resistance value RL to the higher-resistance value RH.

In this circuit, also, by supplying the voltage pulses to the second terminal 8 such that |IRL|>|IbRL| is satisfied as described above, the variable resistance element 10 is allowed to serve as a memory which is stably operative at a high speed.

[Modified Operation 2]

In the above described operation of the variable resistance element of the present embodiment, the voltage value VRL of the write voltage pulse is the constant value. Alternatively, the voltage value VRL may be suitably changed within a range of |IbRH|>|IRL|>|IbRL|. Hereinafter, a description will be given of an exemplary operation in which VRL is increased and IRL is increased with an increase in the number of times of write.

Figure 12A:
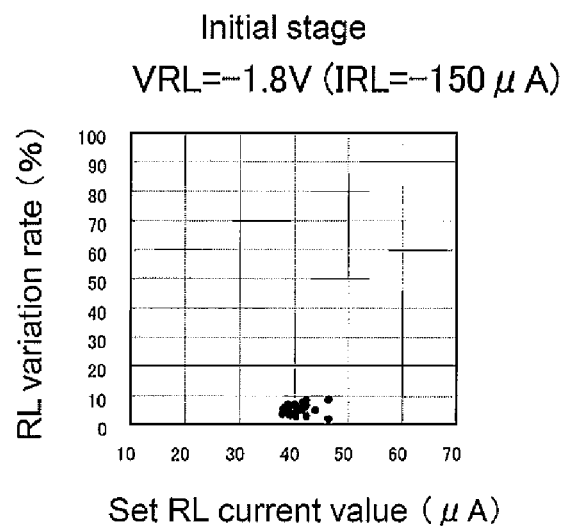
FIG. 12A is a graph showing a relationship between the resistance variation rate and the set RL current value.
Figure 12B:
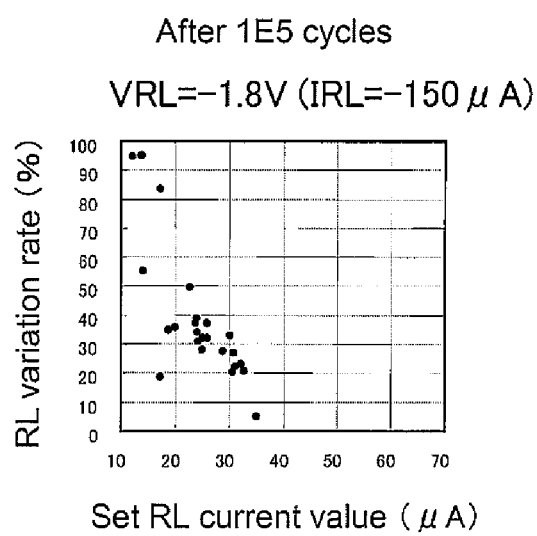
FIG. 12B is a graph showing a relationship between the resistance variation rate and the set RL current value.
Figure 12C:
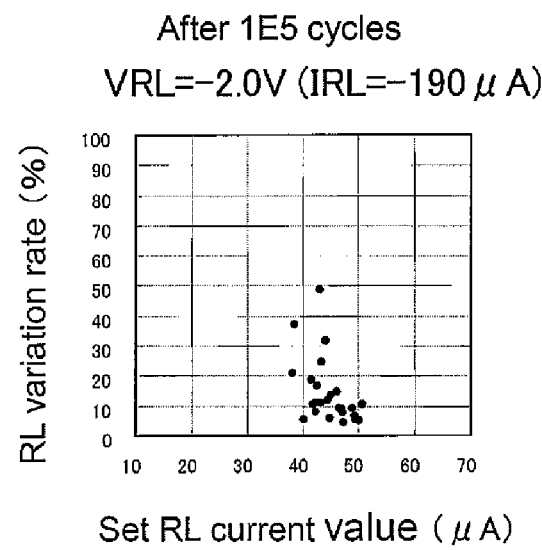
FIG. 12C is a graph showing a relationship between the resistance variation rate and the set RL current value.
Figure 12D:
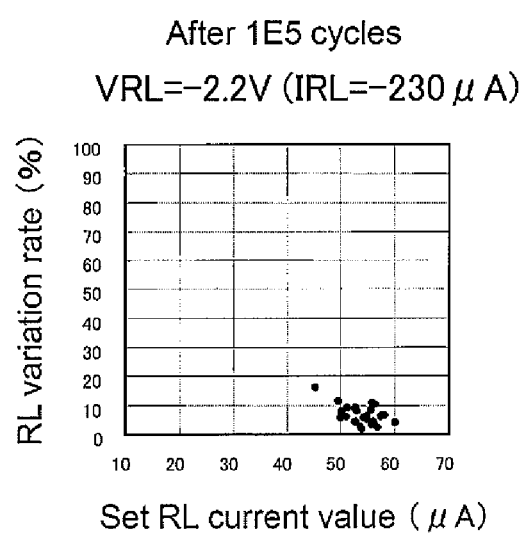
FIG. 12D is a graph showing a relationship between the resistance variation rate and the set RL current value.

First of all, effects provided by increasing IRL as described above will be discussed. FIG. 12A is a graph showing a relationship between the RL variation rate and the set RL current value, from 0-th write to 100-th write. FIG. 12B to 12D are graphs each showing a relationship between the RL variation rate and the set RL current value, after 1E5 cycles (from $10^5$-th write to ($10^5$+100)-th write). FIGS. 12A and 12B are graphs in the case of VRL=−1.8V (IRL=−150 µA). FIGS. 12C and 12D are graphs in the case of VRL=−2.0V (IRL=−190 µA) and VRL=−2.2V (IRL=−230 µA).

As can be seen from comparison between FIGS. 12A and 12B, from 0-th write to 100-th write, the RL variation rates are small values which are equal to or less than 10%, in all set RL current values, whereas after 1E5 cycles, the RL variation rate drastically increases. As can be seen from comparison among FIGS. 12A to 12D, the RL variation rate is a smaller value in the case of VRL=−2.0V (IRL=−190 µA) than in the case of VRL=−1.8V (IRL=−150 µA), and the RL variation rate is a smaller value in the case of VRL=−2.2V (IRL=−230 µA) than in the case of VRL=−2.0V (IRL=−190 µA).

Thus, in the case where the number of times of write exceeds a considerable value, the RL variation rate increases. In that case, by setting IRL to a greater value, the RL variation rate can be decreased. Therefore, by setting IRL to a greater value within the range of |IbRH|>|IRL|>|IbRL|, after the write is performed in repetition, a good endurance characteristic can be attained The above mentioned operation can be related to a verify operation. The verify operation refers to an operation in which in a case where data is written to the variable resistance element, the data preserved in the variable resistance element is read to be checked, the read data is compared to the written data, and write is re-performed if the read data mismatches the written data. In a case where the RL variation rate is high, a situation in which the read data mismatches the written data tends to occur, which may increase the number of times of the verify operation. To avoid this, a threshold (e.g., 100, etc.) of the number of times of the verify operation is preset. If the number of times of the verify operation, which is performed actually, exceeds this threshold, then, VRL is set to a greater value in the write step which is performed thereafter. Thus, a good endurance characteristic can be attained.

As described above, by setting IRL to a greater value within the range of |IbRH|>|IRL|>|IbRL|, a good endurance characteristic can be attained. However, to reduce electric power consumption, IRL may be set to a smallest possible value.

(Embodiment 2)

A non-volatile memory device according to Embodiment 2 is a non-volatile memory device which includes the variable resistance element described in Embodiment 1, and is of a one transistor/one non-volatile memory section type (1T1R type). Hereinafter, configuration and operation of this non-volatile memory device will be described.

[Configuration and Operation of Non-Volatile Memory Device]

Figure 13:
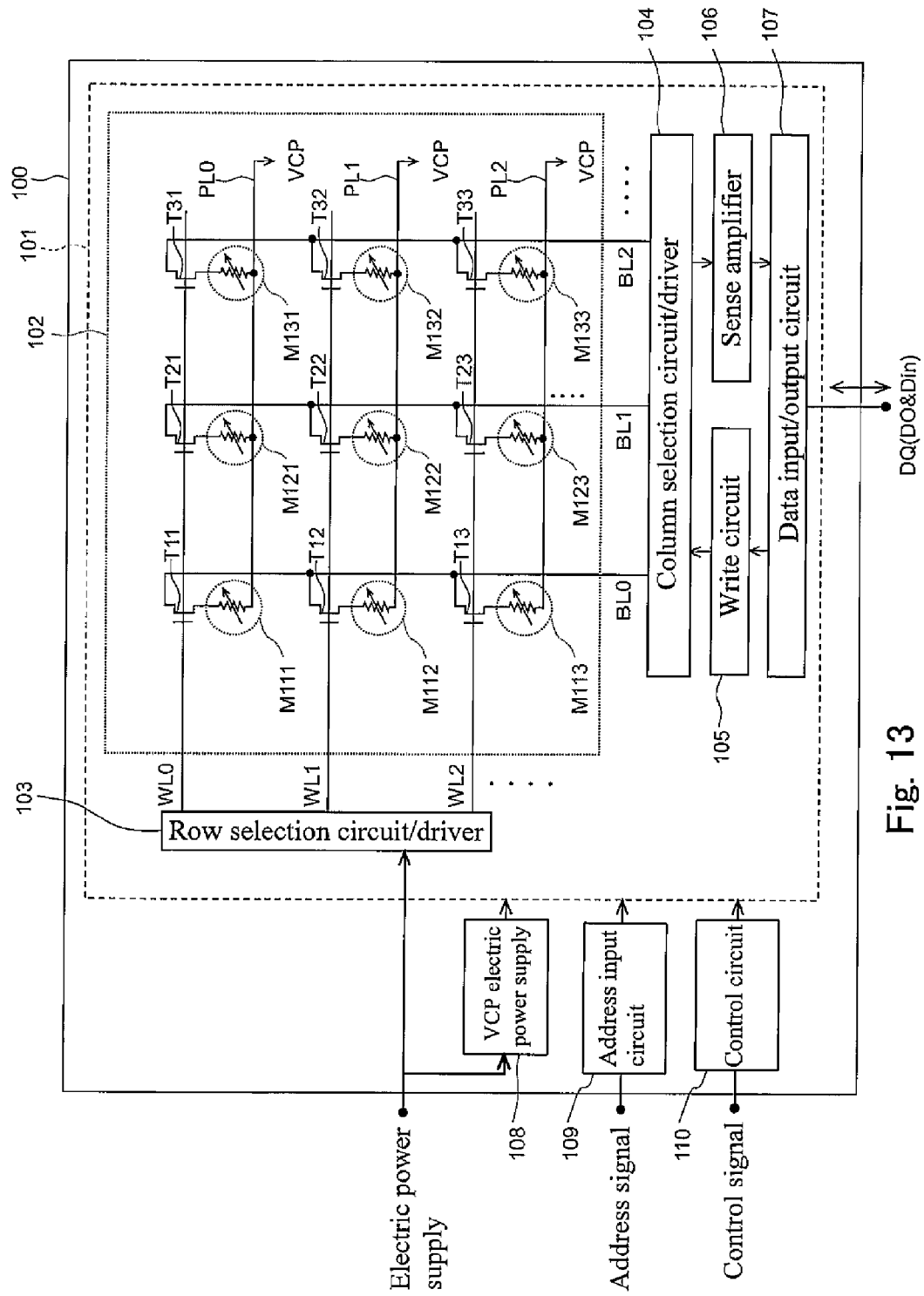
FIG. 13 is a block diagram showing an exemplary configuration of a non-volatile memory device of Embodiment 2.

FIG. 13 is a block diagram showing an exemplary configuration of a non-volatile memory device according to Embodiment 2. As shown in FIG. 13, a non-volatile memory device 100 of 1T1R type includes a memory main body 101 on a semiconductor substrate. The memory main body 101 includes a memory array 102 including variable resistance elements and access transistors (current steering elements), and a voltage application circuit. The voltage application circuit includes, for example, a row selection circuit/driver 103, a column selection circuit 104, a write circuit 105 for writing data, a sense amplifier 106 which detects an amount of a current flowing through a selected bit line and determines which of binary data is stored, and a data input/output circuit 107 which executes input/output processing of input/output data via a terminal DQ.

The non-volatile memory device 100 further includes a cell plate electric power supply (VCP electric power supply) 108, an address input circuit 109 which receives an address signal externally input, and a control circuit 110 for controlling the operation of the memory main body 101, based on a control signal externally input.

The memory array 102 includes a plurality of word lines WL0, WL1, WL2, and a plurality of bit lines BL0, BL1, BL2, . . . which are formed on a semiconductor substrate and are arranged to three-dimensionally cross each other, a plurality of access transistors T11, T12, T13, T21, T22, T23, T31, T32, T33, . . . (hereinafter expressed as "access transistors T11, T12, . . . ") provided to respectively correspond to intersections of the word lines WL0, WL1, WL2, . . . and the bit lines BL0, BL1, BL2, . . . , and a plurality of memory cells M111, M112, M113, M121, M122, M123, M131, M132, M133 (hereinafter expressed as "memory cells M111, M112, . . . " provided to respectively correspond to the access transistors T11, T12, . . . with a one-to-one correspondence. Each of the memory cells M111, M112, . . . corresponds to the variable resistance element 10 of Embodiment 1.

The memory array 102 further includes a plurality of plate lines PL0, PL1, PL2, . . . which are arranged to extend in parallel with the word lines WL0, WL1, WL2, . . . .

Drains of the access transistors T11, T12, T13, . . . are connected to the bit line BL0, drains of the access transistors T21, T22, T23, . . . are connected to the bit line BL1, and drains of the access transistors T31, T32, T33, . . . are connected to the bit line BL2.

Gates of the access transistors T11, T21, T31, . . . are connected to the word line WL0, gates of the access transistors T12, T22, T32, . . . are connected to the word line WL1, and gates of the access transistors T13, T23, T33, . . . are connected to the word line WL2.

Sources of the access transistors T11, T12, . . . are connected to the memory cells M111, M112, . . . , respectively.

The memory cells M111, M121, M131, . . . are connected to the plate line PL0, the memory cells M112, M122, M132, . . . are connected to the plate line PL1, and the memory cells M113, M123, M133, . . . are connected to the plate line PL2.

The address input circuit 109 receives an address signal from an external circuit (not shown), and outputs a row address signal and a column address signal to the row selection circuit/driver 103 and the column selection circuit 104, respectively, based on the address signal. The address signal is a signal indicating the address of a specified memory cell to be selected from among the plurality of memory cells M111, M112, . . . . The row address signal is a signal indicating the address of a row in the address indicated by the address signal, and the column address signal is a signal indicating the address of a column in the address indicated by the address signal.

In the initial step (step S101 in FIG. 2), the control circuit 110 outputs a write signal to the write circuit 105 to command the write circuit 105 to apply the first initial voltage pulse, the second initial voltage pulse, and the erase voltage pulse, in this order, to the memory cells M111, M112, . . . . Upon reception of the write signal, the write circuit 105 outputs a signal to the column selection circuit 104 to command the column selection circuit 104 to apply the first initial voltage pulse, the second initial voltage pulse, and the erase voltage pulse, to all of the bit lines BL0, BL1, BL2, . . . . Upon reception of this signal, the column selection circuit 104 applies the first initial voltage pulse, the second initial voltage pulse, and the erase voltage pulse, to all of the bit lines BL0, BL1, BL2, . . . . At this time, the row selection circuit/driver 103 applies a predetermined voltage to all of the word lines WL0, WL1, WL2, . . . .

As a result of the above, the initial step is completed. Then, in a write step of data (step S102 in FIG. 2), the control circuit 110 outputs a write signal to the write circuit 105 to command the write circuit 105 to apply the write voltage pulse or the erase voltage pulse, based on data Din input to the data input/output circuit 107. By comparison, in a read step of data, the control circuit 110 outputs a read signal to the column selection circuit 104 to command the column selection circuit 104 to apply the read voltage pulse.

The row selection circuit/driver 103 receives the row address signal output from the address input circuit 109, selects one from among the plurality of word lines WL0, WL1, WL2, . . . based on the row address signal and applies a predetermined voltage to the selected word line.

The column selection circuit 104 receives a column address signal output from the address input circuit 109, selects one from among the plurality of bit lines BL0, BL1, BL2, . . . based on the column address signal and applies the write voltage pulse, erase voltage pulse or the read voltage pulse to the selected bit line.

Upon reception of the write signal output from the control circuit 110, the write circuit 105 outputs to the column selection circuit 104 to command the column selection circuit 104 to apply the write voltage pulse or the erase voltage pulse to the selected bit line.

In the read step of data, the sense amplifier 106 detects an amount of a current flowing through the selected bit line which is a read target, and determines the stored data. In the present embodiment, it is assumed that the resistance states of memory cells M111, M112, . . . are a higher-resistance state and a lower-resistance state corresponding to data, respectively. Therefore, the sense amplifier 106 determines which of the resistance states the resistance state of the variable resistance layer of the selected memory cell corresponds with, and determines which of respective data of the binary data is stored, according the determined resistance state. The resultant output data DO is output to an outside circuit via the data input/output circuit 107.

By the above described operation, the non-volatile memory device 100 is able to suppress resistance variation.

(Embodiment 3)

A non-volatile memory device according to Embodiment 3 is a non-volatile memory device which includes the variable resistance element described in Embodiment 1 and is a cross-point non-volatile memory device. Hereinafter, configuration and operation of this non-volatile memory device will be described.

[Configuration and Operation of Non-Volatile Memory Device]

Figure 14:
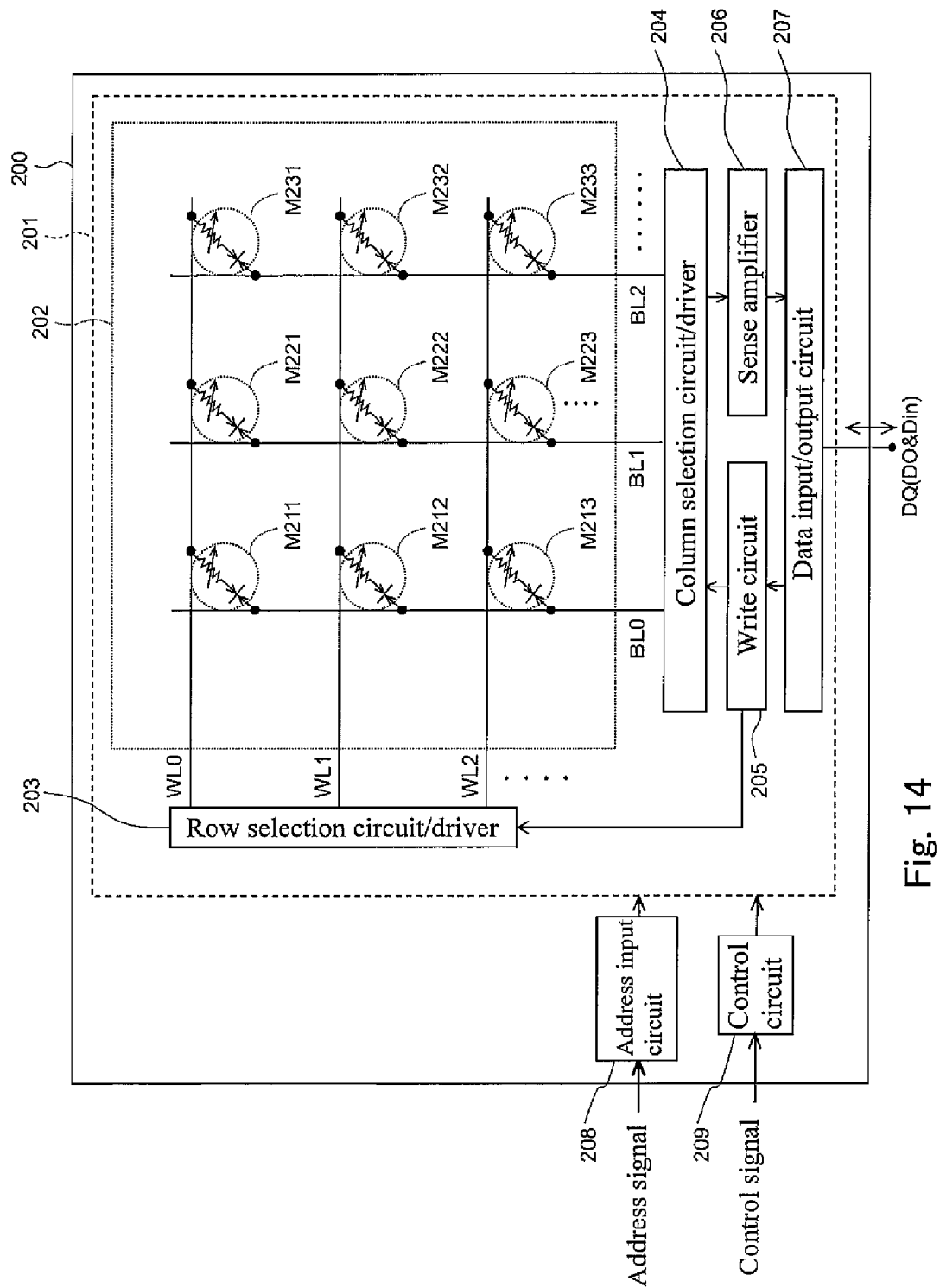
FIG. 14 is a block diagram showing an exemplary configuration of a non-volatile memory device of Embodiment 3.

FIG. 14 is a block diagram showing an exemplary configuration of a non-volatile memory device according to Embodiment 3. As shown in FIG. 14, a non-volatile memory device 200 according to the present embodiment includes a memory main body 201 on a semiconductor substrate. The memory main body 201 includes a memory array 202, a row selection circuit/driver 203, a column selection circuit/driver 204, a write circuit 205 for writing data, a sense amplifier 206 which detects an amount of a current flowing through a selected bit line and determines which of four value data is stored, and a data input/output circuit 207 which executes input/output processing of input/output data via a terminal DQ.

The non-volatile memory device 200 further includes an address input circuit 208 which receives an address signal externally input, and a control circuit 209 for controlling the operation of the memory main body 201, based on a control signal externally input.

The memory array 202 includes a plurality of word lines WL0, WL1, WL2, . . . which are formed to extend in parallel with each other on a semiconductor substrate, and a plurality of bit lines BL0, BL1, BL2, . . . which are formed above the plurality of word lines WL0, WL1, WL2, . . . , so as to extend in parallel with each other within a plane parallel to a main surface of the semiconductor substrate and so as to three-dimensionally cross the plurality of word lines WL0, WL1, WL2, . . . , respectively.

Furthermore, a plurality of memory cells M211, M212, M213, M221, M222, M223, M231, M232, M123, . . . (hereinafter referred to as "memory cells M211, MC212, . . . ") are provided in matrix so as to respectively correspond to cross points of the plurality of word lines WL0, WL1, WL2, . . . , and the plurality of bit lines BL0, BL1, BL2 . . . .

Each of the memory cells M211, MC212, . . . includes an element corresponding to the variable resistance element 10 of Embodiment 1 and a current steering element comprising a MIM (Metal-Insulator-Metal) diode, a MSM (Metal-Semiconductor-Metal) diode, etc. such that the element corresponding to the variable resistance element 10 is connected to the current steering element.

The address input circuit 208 receives an address signal from an external circuit (not shown), and outputs a row address signal and a column address signal to the row selection circuit/driver 203 and the column selection circuit/driver 204, respectively, based on the address signal. The address signal is a signal indicating the address of a specified memory cell to be selected from among the plurality of memory cells M211, M212, . . . . The row address signal is a signal indicating the address of a row in the address indicated by the address signal, and the column address signal is a signal indicating the address of a column in the address indicated by the address signal.

In the initial step (step S101 in FIG. 2), the control circuit 209 outputs a write signal to the write circuit 205 to command the write circuit 205 to apply the first initial voltage pulse, the second initial voltage pulse, and the erase voltage pulse, in this order, to the memory cells M211, M212, . . . . Upon reception of the write signal, the write circuit 105 outputs a signal to the row selection circuit/driver 203 to command the row selection circuit/driver 203 to apply a predetermined voltage to all of the word lines WL0, WL1, WL2, . . . . , and outputs a signal to the column selection circuit/driver 204 to command the column selection circuit/driver 204 to apply the first initial voltage pulse, the second initial voltage pulse, and the erase voltage pulse to all of the bit lines BL0, BL1, BL2, . . . .

As a result of the above operation, the initial step is completed. Then, in a write step of data (step S102 in FIG. 2), the control circuit 209 outputs a write signal to the write circuit 205 to command the write circuit 205 to apply the write voltage pulse or the erase voltage pulse, based on data Din input to the data input/output circuit 207. By comparison, in a read step of data, the control circuit 209 outputs a read signal to the column selection circuit/driver 204 to command the column selection circuit/driver 204 to apply the read voltage pulse.

The row selection circuit/driver 203 receives the row address signal output from the address input circuit 208, selects one from among the plurality of word lines WL0, WL1, WL2, . . . based on the row address signal and applies a predetermined voltage to the selected word line.

The column selection circuit/driver 204 receives a column address signal output from the address input circuit 208, selects one from among the plurality of bit lines BL0, BL1, BL2, . . . based on the column address signal and applies the write voltage pulse, the erase voltage pulse, or the read voltage pulse to the selected bit line.

Upon reception of the write signal output from the control circuit 209, the write circuit 205 outputs a signal to the row selection circuit/driver 203 to command the row selection circuit/driver 203 to apply a voltage to the selected word line, and outputs a signal to the column selection circuit/driver 204 to command the column selection circuit/driver 204 to apply the write voltage pulse or the erase voltage pulse to the selected bit line.

In the read step of data, the sense amplifier 206 detects an amount of a current flowing through the selected bit line which is a read target, and determines the stored data. In the present embodiment, it is assumed that the resistance states of memory cells M211, M212, . . . are a higher-resistance state and a lower-resistance state corresponding to data, respectively. Therefore, the sense amplifier 206 determines which of the resistance states the resistance state of the variable resistance layer of the selected memory cell corresponds with, and determines which of the binary data is stored, according the determined resistance state. The resultant output data DO is output to an outside circuit via the data input/output circuit 207.

By the above described operation, the non-volatile memory device 200 is able to suppress resistance variation.

The memory arrays of the non-volatile memory device of the present embodiment of FIG. 14 may be stacked together three-dimensionally to implement a non-volatile memory device having a multi-layer structure. By providing the multi-layer memory array thus configured, a super-high capacity non-volatile memory device can be implemented.

(Embodiment 4)

A method of driving a variable resistance element of Embodiment 4 including a first electrode; a second electrode; and a metal oxide layer which is provided between the first electrode and the second electrode and changes its resistance value in response to a voltage pulse applied between the first electrode and the second electrode, wherein the metal oxide layer has a first oxide region connected to the first electrode; and a second oxide region connected to the second electrode and having a higher oxygen content atomic percentage than the first oxide region, comprises the steps of applying a write voltage pulse of a first polarity between the first electrode and the second electrode to change a resistance state of the metal oxide layer from a higher-resistance state to a lower-resistance state to place the metal oxide layer in a write state; applying an erase voltage pulse of a second polarity which is different from the first polarity between the first electrode and the second electrode to change the resistance state of the metal oxide layer from the lower-resistance state to the higher-resistance state to place the metal oxide layer in an erase state; and before a first write step is performed; applying a first initial voltage pulse of the second polarity between the first electrode and the second electrode to change the resistance value of the metal oxide layer from a resistance value corresponding to an initial state of the metal oxide layer to a first resistance value, and then applying a second initial voltage pulse of the first polarity between the first electrode and the second electrode to change the resistance value of the metal oxide layer from the first resistance value to a second resistance value; wherein when the resistance value corresponding to the initial state of the metal oxide layer is R0, the resistance value corresponding to the write state is RL, the resistance value corresponding to the erase state is RH, the first resistance value is R1, the second resistance value is R2, a voltage value of the first initial voltage pulse is VbRH, a voltage value of the second initial voltage pulse is VbRL, a voltage value of the write voltage pulse is VRL, and a voltage value of the erase voltage pulse is VRH, $R0 > R1 \geq RH > R2 \geq RL$, $|VbRH| > |VRL| > |VbRL|$ and $|VbRH| > |VRH|$ are satisfied.

In such a configuration, the variable resistance element is able to stably change its resistance state.

In the above driving method, the voltage value VRL of the write voltage pulse may be $|VRL| > |VbRL| \times 1.08$.

In the above driving method, the metal oxide may be any of a tantalum oxide, a hafnium oxide, and a zirconium oxide.

In the above driving method, the first oxide region contains an oxide having a composition expressed as $TaO_x$ ($0.8 \leq x \leq 1.9$), and the second oxide region contains an oxide having a composition expressed as $TaO_y$ ($2.1 \leq y \leq 2.5$).

In the above driving method, the voltage value of the write voltage pulse may be increased to be greater in a present write step after the write step has been performed in repetition than in previous write steps.

The above driving method may further comprises the step of verifying the resistance state of the metal oxide after the write step and re-performing the write step when it is determined that the write state has not been implemented, as a result of the verification, wherein the voltage value of the write voltage pulse may be increased to be greater in a present write step after the verifying step has been performed plural times than in previous write steps.

A non-volatile memory device of Embodiment 4 comprises a variable resistance element including a first electrode, a second electrode, and a metal oxide layer which is provided between the first electrode and the second electrode and changes its resistance value in response to a voltage pulse applied between the first electrode and the second electrode, and a voltage pulse application circuit for applying a predetermined voltage pulse to the variable resistance element, wherein the metal oxide layer has a first oxide region connected to the first electrode, and a second oxide region connected to the second electrode and having a higher oxygen content atomic percentage than the first oxide region, wherein the voltage pulse application circuit applies a write voltage pulse of a first polarity between the first electrode and the second electrode to change a resistance state of the metal oxide layer from a higher-resistance state to a lower-resistance state to place the metal oxide layer in a write state; wherein the voltage pulse application circuit applies an erase voltage pulse of a second polarity which is different from the first polarity between the first electrode and the second electrode to change the resistance state of the metal oxide layer from the lower-resistance state to the higher-resistance state to place the metal oxide layer in an erase state; and wherein before the metal oxide layer is placed in the write state, the voltage pulse application circuit applies a first initial voltage pulse of the second polarity between the first electrode and the second electrode to change the resistance value of the metal oxide layer from a resistance value corresponding to an initial state of the metal oxide layer to a first resistance value and then applies a second initial voltage pulse of the first polarity between the first electrode and the second electrode to change the resistance value of the metal oxide layer from the first resistance value to a second resistance value, wherein when the resistance value corresponding to the initial state of the metal oxide layer is R0, the resistance value corresponding to the write state is RL, the resistance value corresponding to the erase state is RH, the first resistance value is R1, the second resistance value is R2, a voltage value of the first initial voltage pulse is VbRH, a voltage value of the second initial voltage pulse is VbRL, a voltage value of the write voltage pulse is VRL, and a voltage value of the erase voltage pulse is VRH, $R0 > R1 \geq RH > R2 \geq RL$, $|VbRH| > |VRL| > |VbRL|$ and $|VbRH| > |VRH|$ are satisfied.

In this configuration, a memory device which is able to stably operate can be implemented.

In the non-volatile memory device, the voltage value VRL of the write voltage pulse may be $|VRL| > |VbRL| \times 1.08$.

In the non-volatile memory device, the metal oxide may be any of a tantalum oxide, a hafnium oxide, and a zirconium oxide.

In the non-volatile memory device, the first oxide region contains an oxide having a composition expressed as $TaO_x$ ($0.8 \leq x \leq 1.9$), and the second oxide region contains an oxide having a composition expressed as $TaO_y$ ($2.1 \leq y \leq 2.5$).

In the non-volatile memory device, the voltage pulse application circuit may be configured to apply the write voltage pulse such that a voltage value is greater in a present case where the write voltage pulse is applied after the write voltage pulse has been applied in repetition, than in previous cases where the write voltage pulses have been applied.

The non-volatile memory device may further comprise a verification means which verifies the resistance state of the metal oxide after the write voltage pulse is applied; wherein the voltage pulse application circuit may be configured to re-apply the write voltage pulse when the verification means determines that the write state has not been implemented, as a result of the verification; and wherein the voltage pulse application circuit may be configured to apply the write voltage pulse such that a voltage value is greater in a present case where the write voltage pulse is applied after the voltage pulse has been re-applied plural times, than in previous cases where the write voltage pulses have been applied.

The non-volatile memory device may further comprise a current steering element electrically connected to the first electrode or the second electrode. In this case, the current steering element may be a transistor or a diode.

[Configuration of Variable Resistance Element]

The configuration of the variable resistance element according to Embodiment 4 may be similar to that of Embodiment 1, and will not be described in detail in repetition.

[Manufacturing Method of Variable Resistance Element]

The manufacturing method of the variable resistance element according to Embodiment 4 may be similar to that of Embodiment 1, and will not be described in detail in repetition.

Alternatively, $0.8 \leq x \leq 1.9$ and $2.1 \leq y$ may be satisfied. In such a configuration, stable resistance change can be implemented like the resistance changing characteristic of Embodiment 1.

[Operation of Variable Resistance Element]

In Embodiment 4, when the voltage value of the first initial voltage pulse in the higher-resistance state attaining break is VbRH, the voltage value of the second initial voltage pulse in the lower-resistance state attaining break is VbRL, the voltage value of the write voltage pulse in the write step (lower-resistance state attaining process) is VRL, and the voltage value of the erase voltage pulse in the erase step (higher-resistance state attaining process) is VRH, a relationship of $|VbRH| > |VRL| > |VbRL|$ and $|VbRH| > |VRH|$ are satisfied. By satisfying this relationship, a stable resistance changing operation can be implemented as will be described later.

Figure 15:
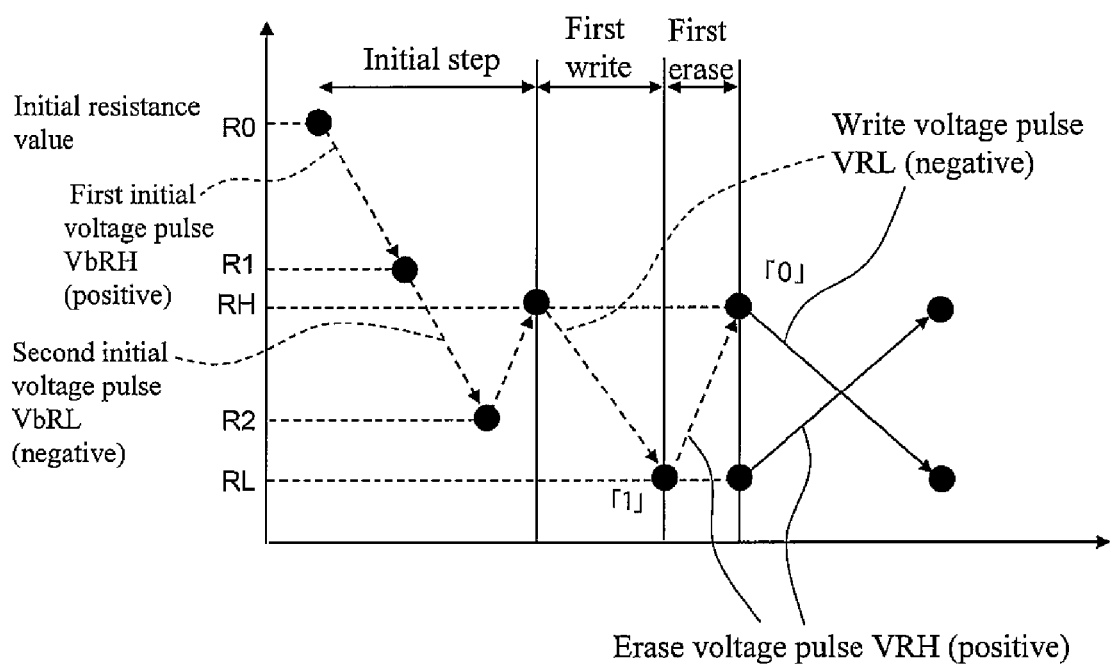
FIG. 15 is a view showing a change in a resistance value of a metal oxide layer of a variable resistance element of Embodiment 4, in a case where data is written to the variable resistance element (write step), a case where data is erased from the variable resistance element (erase step), and in the initial step performed with respect to the variable resistance element before first write is performed.

FIG. 15 is a view showing a change in the resistance value of the metal oxide layer 3 of the variable resistance element 10 of Embodiment 4, in a case where data is written to the variable resistance element 10 (write step), a case where data is erased from the variable resistance element 10 (erase step), and in the initial step performed with respect to the variable resistance element 10 before the first write step is performed. In the write step, the erase step and the initial step, as shown in FIG. 15, when the positive voltage pulse is applied, a predetermined positive voltage pulse is supplied to the second terminal 8 on the basis of the first terminal 7, while when the negative voltage pulse is applied, a predetermined positive voltage pulse is supplied to the first terminal 7 on the basis of the second terminal 8.

When the positive first initial voltage pulse (voltage value VbRH) is supplied between the second terminal 8 and the first terminal 7 in a case where the variable resistance element 10 is in the initial state (the resistance value of the metal oxide layer 3 is the initial resistance value R0), the resistance value of the metal oxide layer 3 decreases from the initial resistance value R0 to the first resistance value R1 (higher-resistance state attaining break process), as shown in FIG. 15. Then, when the negative second initial voltage pulse (voltage value VbRL) is supplied between the second terminal 8 and the first terminal 7, the resistance value of the metal oxide layer 3 further decreases from the first resistance value R1 to the second resistance value R2 (lower-resistance state attaining break process). Then, when the positive erase voltage pulse (voltage value VRH) is supplied between the second terminal 8 and the first terminal 7, the resistance value of the metal oxide layer 3 increases from the second resistance value R2 to the higher-resistance value RH (higher-resistance state attaining process). Through the above operation, the initial step finishes.

After the above stated initial step finishes, when the negative write voltage pulse (voltage value VRL) is supplied between the second terminal 8 and the first terminal 7, the resistance value of the metal oxide layer 3 decreases from the higher-resistance value RH to the lower-resistance value RL as shown in FIG. 15 (first write). Thus, 1-bit data representing "1" is written to the variable resistance element 10. Then, when the positive erase voltage pulse (voltage value VRH) is supplied between the second terminal 8 and the first terminal 7, the resistance value of the metal oxide layer 3 increases from the lower-resistance value RL to the higher-resistance value RH (first erase). Thus, 1-bit data representing "0" is written to the variable resistance element 10.

Since the resistance value of the metal oxide layer 3 is such that the initial resistance value R0 is greatest and the higher-resistance value RH is greater than the lower-resistance value RL, a relationship of R0>RH>RL is satisfied. Since in the present embodiment, the first resistance value R1 in the initial step is equal to or greater than the higher-resistance value RH, and the second resistance value R2 in the initial step is equal to or greater than the lower-resistance value RL, a relationship of R0>R1 ≥RH>R2≥RL is satisfied.

Then, when the negative write voltage pulse (voltage value VRL) is supplied to the second terminal 8 in a case where the resistance value of the metal oxide layer 3 is the higher-resistance value RH, the resistance value of the metal oxide layer 3 changes from the higher-resistance value RH to the lower-resistance value RL. On the other hand, when the positive erase voltage pulse (voltage value VRH) is supplied to the second terminal 8 in a case where the resistance value of the metal oxide layer 3 is the lower-resistance value RL, the resistance value of the metal oxide layer 3 changes from the lower-resistance value RL to the higher-resistance value RH.

In the circuit for operating the variable resistance element of Embodiment 4, also, by supplying the voltage pulses to the second terminal 8 such that the relationship of |VbRH|>|VRL|>|VbRL| and |VbRH|>|VRH| is satisfied as described above, the variable resistance element 10 is allowed to serve as a memory which is stably operative at a high speed.

Except for the above, the operation of the variable resistance element of Embodiment 4 may be the same as the operation described in Embodiment 1, including the operation described with reference to FIGS. 2, 3, 5, 6, 7 and 8, and its detailed description will not be given in repetition.

[Relationship Among Voltage Values of Voltage Pulses]

"Variation of resistance value" and "RL variation rate" are the same as those described in Embodiment 1, and its detailed description will not be given in repetition.

Next, a description will be given of a relationship among the voltage values of the first and second initial voltage pulses, the write voltage pulse, and the erase voltage pulse, in conjunction with the RL variation rate.

Figures 16A, 16B:
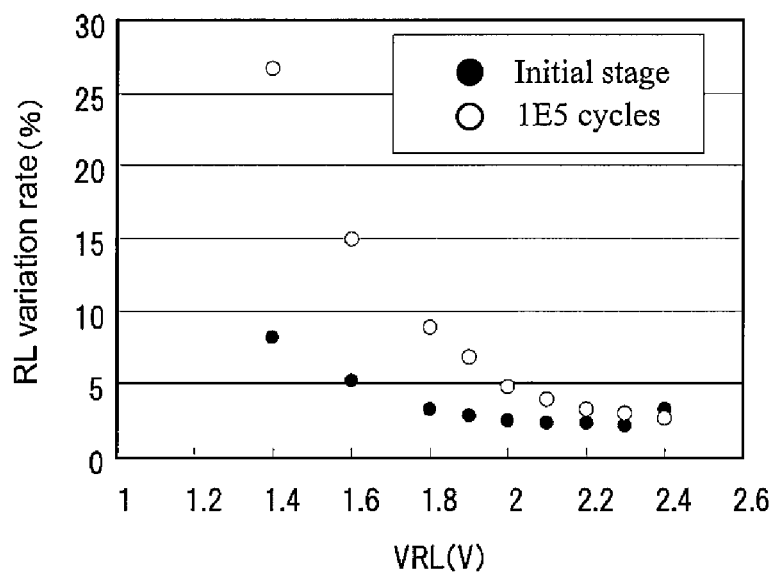
FIG. 16A is a table showing evaluation of the resistance variation rate.
FIG. 16B is a table showing evaluation of the resistance variation rate.

FIGS. 16A and 16B are views showing results of evaluation of the RL variation rates in a case where the write voltage pulse (VRL) and the erase voltage pulse (VRLH) are changed, regarding the variable resistance element which has gone through the higher-resistance state attaining break process using VbRH=+3.3V, the lower-resistance state attaining break process using VbRL=−1.8V, and the higher-resistance state attaining process using VRH=+2.4V, in the initial step. In FIG. 16A, reference symbol "○" indicates that the RL variation rate is equal to or less than 5%, while reference symbol "X" indicates that the RL variation rate is greater than 5%. In columns of "initial stage" in FIG. 16A, results of the evaluation of the RL variation rates from 0-th write to 100-th write are represented, while in columns of "after 1E5 cycles" in FIG. 16A, results of evaluation of the RL variation rates from $10^5$-th write to $(10^5+100)$-th write. The term "1E5 cycles" refers to $10^5$ cycles.

As shown in FIG. 16A, in the initial stage, the variation rates are "X" only in the case of VRL=−1.4V and VRL=−1.6V and are "○" in the cases where an absolute value of VRL is greater than in the above cases. By comparison, after 1E5 ($10^5$) cycles, the variation rates are "X" in the case of VRL=−1.8V and VRL=−1.9V (=|1.06×VbRL|) in addition to VRL=−1.4V and VRL=−1.6V. FIG. 16B is a graph showing the above results as a relationship between VRL and the RL variation rate.

Figure 17A:
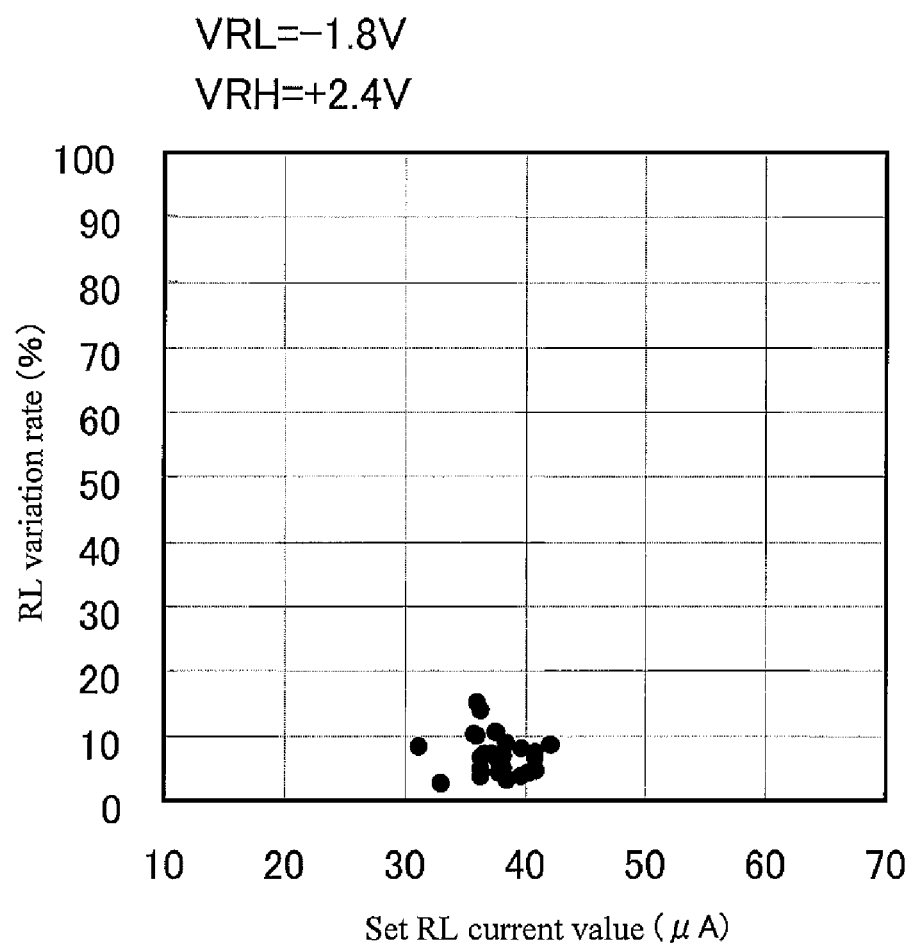
FIG. 17A is a graph showing a relationship between the resistance variation rate and the set RL current value.
Figure 17B:
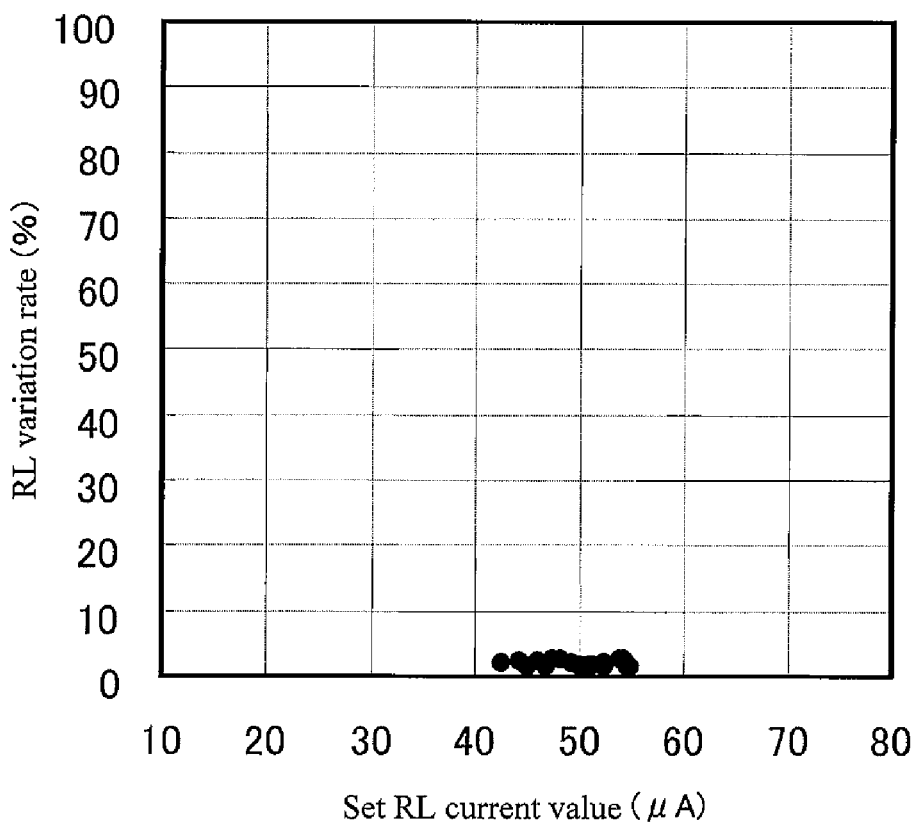
FIG. 17B is a graph showing a relationship between the resistance variation rate and the set RL current value.

FIG. 17A is a graph showing a relationship between the RL variation rate and the set RL current value in the case of VRL=−1.8V. FIG. 17B is a graph showing a relationship between the RL variation rate and the set RL current value in the case of VLR=−2.0V. The set RL current value indicates a read current value in a case where data is written to elements of 25 bits. The voltage values of the voltage pulses in the initial step are similar to those of FIGS. 16A and 16B.

As shown in FIG. 17A, in the case of VRL=−1.8V, the RL variation rates are great values in almost all set RL current values, including a case where, for example, the RL variation rate exceeds 10% in a certain set RL current value. By comparison, as shown in FIG. 17B, in the case of VRL=−2.0V, the RL variation rates are small values which are equal to or less than 5%, in all set RL current values.

From FIGS. 16A, 16B, 17A and 17B, it is confirmed that, to implement a stable resistance changing operation, |VRL|>1.8V is required in the case of |VbRL|=1.8V. In addition, it is confirmed that, to implement a stable resistance changing operation in cases where the number of times of write increases, a variation among bits is considered, etc., |VRL|≥2.0V (=|1.11×VbRL|) may be set in the case of |VbRL|=1.8V.

FIG. 18 is a view showing results of evaluation of the RL variation rates under driving conditions in a case where the write voltage pulse (VRL) and the erase voltage pulse (VRLH) are changed, regarding the variable resistance element which has gone through the higher-resistance state attaining break process using VbRH=+3.3V, the lower-resistance state attaining break process using VbRL=−2.4V, and the higher-resistance state attaining process using VRH=+3.0V, in the initial step. As shown in FIG. 12, in the initial stage, the RL variation rates are "X" from VRL=−1.4V to VRL=−2.2V, and are "○" in the cases where an absolute value of VRL is greater than in the above cases. By comparison, after the 1E5 cycles, the RL variation rates are "X" from VRL=−1.4V to VRL=−2.5V (=|1.04×VbRL|) and are "○" in the cases where the absolute value of VRL is equal to or greater than 2.6V (=|1.08×VbRL|). From these experiment results and additional experiment results, it was found that, to implement a stable resistance changing operation in cases where the number of times of write increases, a variation among bits is considered, etc., the variation rates are "○" when the absolute value of VRL is greater than |VbRL|×1.08.

From the above, it can be seen that a stable resistance changing operation is implemented when the relationship of |VRL|>|VbRL| is satisfied. It can also be seen that, to implement a stable resistance changing operation in cases where the number of times of write increases, a variation among bits is considered, etc., the relationship of |VRL|>|VbRL|×1.08 may be satisfied.

In Embodiment 1, in the case of |VRL|>|VbRH|, a failure occurs, in which the variable resistance element does not easily change to the higher-resistance state, and the RH current value is unstable. In addition, in the case of |VRH|≥|VbRH|, a failure occurs, in which the variable resistance element does not easily change to the lower-resistance state, and the RL current value is unstable. Therefore, it may be said that when a relationship of |VbRH|>|VRL|>|VbRL| and |VbRH|>|IRH| is satisfied, a stable resistance changing operation can be implemented. Furthermore, it may be said that when a relationship of |VbRH|>|VRL|>|VbRL|×1.08 and |VbRH|>|VRH| is satisfied, a stable resistance changing operation can be implemented in cases where the number of times of write increases, a variation among bits is considered, etc.

[Modified Operation]

In the above described operation of the variable resistance element of the present embodiment, the voltage value VRL of the write voltage pulse is the constant value. Alternatively, the voltage value VRL may be suitably changed within a range of |VbRH|>|VRL|>|VbRL|. Hereinafter, a description will be given of an exemplary operation in which VRL is increased with an increase in the number of times of write.

Figure 19A:
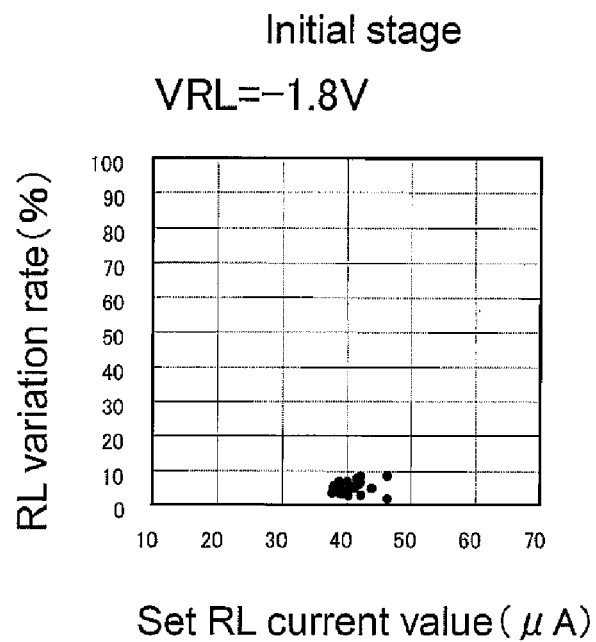
FIG. 19A is a graph showing a relationship between the resistance variation rate and the set RL current value.
Figure 19B:
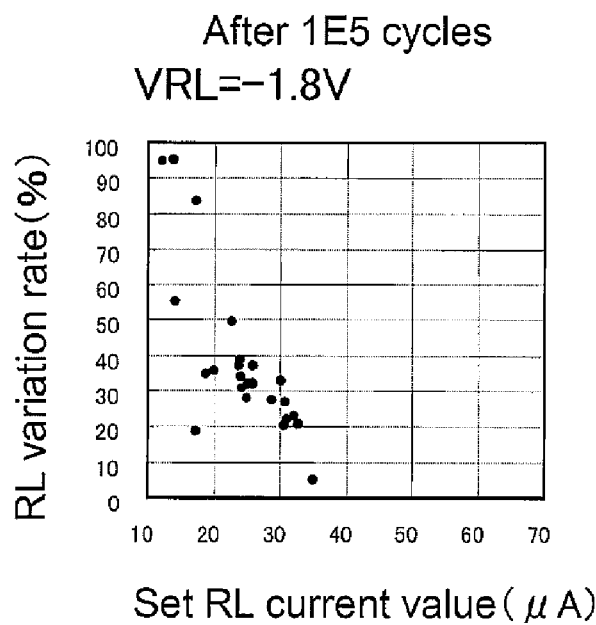
FIG. 19B is a graph showing a relationship between the resistance variation rate and the set RL current value.
Figure 19C:
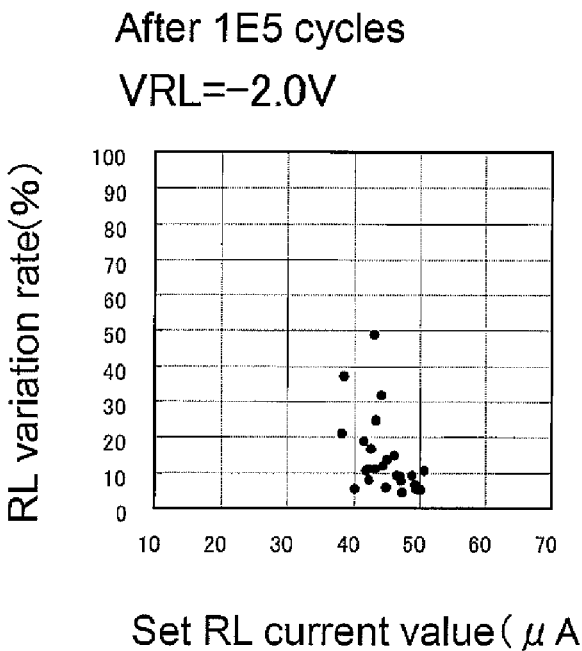
FIG. 19C is a graph showing a relationship between the resistance variation rate and the set RL current value.
Figure 19D:
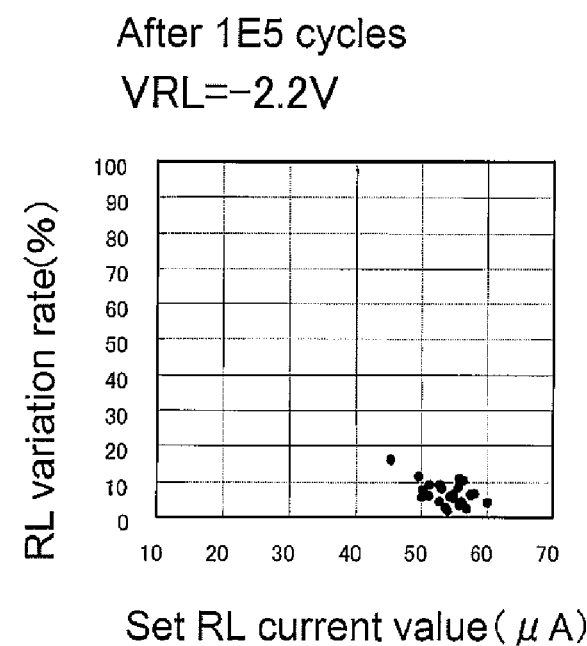
FIG. 19D is a graph showing a relationship between the resistance variation rate and the set RL current value.

First of all, effects provided by increasing VRL as described above will be discussed. FIG. 19A is a graph showing a relationship between the RL variation rate and the set RL current value from 0-th write to 100-th write. FIG. 19B to 19D are graphs each showing a relationship between the RL variation rate and the set RL current value after 1E5 cycles (from $10^5$-th write to ($10^5$+100)-th write). FIGS. 19A and 19B are graphs in the case of VRL=−1.8V. FIGS. 19C and 19D are graphs in the case of VRL=−2.0V and VRL=−2.2V.

As can be seen from comparison between FIGS. 19A and 19B, from 0-th write to 100-th write, the RL variation rates are small values which are equal to or less than 10%, in all set RL current values, whereas after 1E5 cycles, the RL variation rate drastically increases. As can be seen from comparison among FIGS. 19B to 19D, the RL variation rate is a smaller value in the case of VRL=−2.0V than in the case of VRL=−1.8V, and the RL variation rate is a smaller value in the case of VRL=−2.2V than in the case of VRL=−2.0V.

Thus, in the case where the number of times of write exceeds a considerable value, the RL variation rate increases. In that case, by setting VRL to a greater value, the RL variation rate can be lessened. Therefore, by setting VRL to a greater value within the range of |VbRH|>|VRL|>|VbRL|, after the write is performed in repetition, a good endurance characteristic can be attained.

The above mentioned operation can be related to a verify operation. The verify operation refers to an operation in which in a case where data is written to the variable resistance element, the data preserved in the variable resistance element is read to be checked, the read data is compared to the written data, and write is re-performed if the read data mismatches the written data. In a case where the RL variation rate is high, a situation in which the read data mismatches the written data tends to occur, which may increase the number of times of the verify operation. To avoid this, a threshold (e.g., 100, etc.) of the number of times of the verify operation is preset. If the number of times of the verify operation, which is performed actually, exceeds this threshold, then, VRL is set to a greater value in the write step which is performed thereafter. Thus, a good endurance characteristic can be attained.

As described above, by setting VRL to a greater value within the range of |VbRH|>|VRL|>|VbRL|, a good endurance characteristic can be attained. However, to reduce electric power consumption, VRL may be set to a smallest possible value.

Embodiment 4 may be modified like Embodiment 1. Embodiment 4 and modified example of Embodiment 4 may be combined with any of Embodiment 2 and Embodiment 3.

(Other Embodiments)

Although in the above embodiments, the metal oxide layer comprises the stacked-layer structure of the tantalum oxide, the present invention is not limited to this, so long as the metal oxide layer comprises a stacked-layer structure of transition metal oxide. For example, the metal oxide layer comprises a stacked-layer structure of hafnium (Hf) oxide, zirconium (Zr) oxide, etc.

In the case of using the stacked-layer structure of hafnium oxide, when a composition of a first hafnium oxide is $HfO_x$, and a composition of a second hafnium oxide is $HfO_y$, x may be in a range of about $0.9 \leq x \leq 1.6$, y may be in a range of about $1.9 \leq y \leq 2.0$, and the second hafnium oxide may have a thickness which is not less than 3 nm and not more than 4 nm.

In the case of using the hafnium oxide, a first hafnium oxide layer is deposited on the first electrode 2, by reactive sputtering in which sputtering is conducted using a Hf target in atmosphere of an argon gas and an oxygen gas. A second hafnium oxide layer is formed by exposing a surface of the first hafnium oxide layer in plasma of the argon gas and the oxygen gas after the first hafnium oxide layer is deposited. An oxygen content atomic percentage of the first hafnium oxide layer can be easily adjusted by changing a flow ratio of the oxygen gas with respect to the argon gas during the reactive sputtering. A substrate temperature may be a room temperature without particularly heating the substrate.

In the case of using the stacked-layer structure of zirconium oxide, when a composition of a first zirconium oxide is $ZrO_x$, and a composition of a second zirconium oxide is $ZrO_y$, x may be in a range of about $0.9 \leq x \leq 1.4$, y may be in a range of about $1.8 \leq y \leq 2.0$, and the second zirconium oxide may have a thickness which is not less than 1 nm and not more than 5 nm.

In the case of using the zirconium oxide, a first zirconium oxide layer is deposited on the first electrode 2, by reactive sputtering in which sputtering is conducted using a Zr target in atmosphere of the argon gas and the oxygen gas. A second zirconium oxide layer is formed by exposing a surface of the first zirconium oxide layer in plasma of the argon gas and the oxygen gas after the first zirconium oxide layer is deposited. An oxygen content atomic percentage of the first zirconium oxide layer can be easily adjusted by changing a flow ratio of the oxygen gas with respect to the argon gas during the reactive sputtering. A substrate temperature may be a room temperature without particularly heating the substrate.

Industrial Applicability

A driving method of a variable resistance element and a non-volatile memory device of the present invention are useful as a driving method of a variable resistance element and a memory device which are incorporated into various electronic devices such as personal computers, cellular phones, etc.

REFERENCE SIGNS LIST 1 substrate
2 first electrode
3 metal oxide layer
3a first tantalum oxide layer
3b second tantalum oxide layer
4 second electrode
5 electric power supply
6 protective resistor
7 first terminal
8 second terminal
10 variable resistance element
13 transistor
100 non-volatile memory device
101 memory main body
102 memory array
103 row selection circuit/driver
104 column selection circuit
105 write circuit
106 sense amplifier
107 data input/output circuit
108 electric power supply
109 address input circuit
110 control circuit
200 non-volatile memory device
201 memory body section
202 memory array
203 row selection circuit/driver
204 column selection circuit/driver
205 write circuit
206 sense amplifier
207 data input/output circuit
208 address input circuit
209 control circuit

The invention claimed is:

1. A method of driving a variable resistance element including a first electrode, a second electrode, and a metal oxide layer which is provided between the first electrode and the second electrode and changes its resistance value in response to a voltage pulse applied between the first electrode and the second electrode,
wherein the metal oxide layer has a first oxide region connected to the first electrode, and a second oxide region connected to the second electrode and having a higher oxygen content atomic percentage than the first oxide region, the method comprising the steps of:
applying a write voltage pulse of a first polarity between the first electrode and the second electrode to change a resistance state of the metal oxide layer from a higher-resistance state to a lower-resistance state to place the metal oxide layer in a write state;
applying an erase voltage pulse of a second polarity which is different from the first polarity between the first electrode and the second electrode to change the resistance state of the metal oxide layer from the lower-resistance state to the higher-resistance state to place the metal oxide layer in an erase state;
before the resistance value of the metal oxide layer first attaining a resistance value RL corresponding to the write state, changing the resistance value of the metal oxide layer from a resistance value R0 corresponding to an initial state of the metal oxide layer to another resistance value R2, by applying at least a first initial voltage pulse of the first polarity between the first electrode and the second electrode; and
before the resistance value of the metal oxide layer first attaining the resistance value RL corresponding to the write state, applying a second initial voltage pulse of the second polarity between the first electrode and the second electrode, to change the resistance value of the metal oxide layer from the another resistance value R2 to the resistance value RH corresponding to the erase state,
wherein when a maximum value of a current flowing through the metal oxide layer when the first initial voltage pulse is applied is IbRL, and a maximum value of the current flowing through the metal oxide layer when the write voltage pulse is applied is IRL,
R0>RH>R2>RL, and
|IRL|>|IbRL| are satisfied.

2. The method of driving the variable resistance element according to claim 1,
wherein the maximum value IRL of the current flowing through the metal oxide layer when the write voltage pulse is applied satisfies a relationship of |IRL|>|IbRL|× 1.18.

3. The method of driving the variable resistance element according to claim 1,
wherein the metal oxide layer comprises one of a tantalum oxide, a hafnium oxide, and a zirconium oxide.

4. The method of driving the variable resistance element according to claim 3,
wherein the first oxide region contains an oxide having a composition expressed as $TaO_x$ ($0.8 \leq x \leq 1.9$), and the second oxide region contains an oxide having a composition expressed as $TaO_y$ ($2.1 \leq y \leq 2.5$).

5. The method of driving the variable resistance element according to claim 1,
wherein the maximum value of the current flowing through the metal oxide when the write voltage pulse is applied is increased to be greater in a present write step after the write step has been performed in repetition, than in previous write steps.

6. The method of driving the variable resistance element according to claim 5, further comprising the step of:
verifying the resistance state of the metal oxide layer after the write step and re-performing the write step when it is determined that the write state has not been implemented, as a result of the verification,
wherein the maximum value of the current flowing through the metal oxide when the write voltage pulse is applied is increased to be greater in a present write step after the verifying step has been performed plural times, than in previous write steps.

7. A non-volatile memory device comprising:
a variable resistance element including a first electrode, a second electrode, and a metal oxide layer which is provided between the first electrode and the second electrode and changes its resistance value in response to a voltage pulse applied between the first electrode and the second electrode; and
a voltage pulse application circuit for applying a predetermined voltage pulse to the variable resistance element;
wherein the metal oxide layer has a first oxide region connected to the first electrode, and a second oxide region connected to the second electrode and having a higher oxygen content atomic percentage than the first oxide region;
wherein the voltage pulse application circuit applies a write voltage pulse of a first polarity between the first electrode and the second electrode to change a resistance state of the metal oxide layer from a higher-resistance state to a lower-resistance state to place the metal oxide layer in a write state;

wherein the voltage pulse application circuit applies an erase voltage pulse of a second polarity which is different from the first polarity between the first electrode and the second electrode to change the resistance state of the metal oxide layer from the lower-resistance state to the higher-resistance state to place the metal oxide layer in an erase state;

wherein before the resistance value of the metal oxide layer first attaining a resistance value RL corresponding to the write state, the voltage pulse application circuit changes the resistance value of the metal oxide layer from a resistance value R0 corresponding to an initial state of the metal oxide layer to another resistance value R2, by applying at least a first initial voltage pulse of the first polarity between the first electrode and the second electrode;

wherein before the resistance value of the metal oxide layer first attaining the resistance value RL corresponding to the write state, the voltage pulse application circuit applies a second initial voltage pulse of the second polarity between the first electrode and the second electrode, to change the resistance value of the metal oxide layer from the another resistance value R2 to the resistance value RH corresponding to the erase state; and wherein when the resistance value corresponding to the write state is RL, a maximum value of a current flowing through the metal oxide layer when the first initial voltage pulse is applied is IbRL, and a maximum value of the current flowing through the metal oxide layer when the write voltage pulse is applied is IRL, R0>RH>R2>RL, and

|IRL|>|IbRL| are satisfied.

8. The non-volatile memory device according to claim 7, wherein the maximum value IRL of the current flowing through the metal oxide layer when the write voltage pulse is applied satisfies a relationship of |IRL|≥|IbRL|×1.18.

9. The non-volatile memory device according to claim 7, wherein the metal oxide layer comprises one of a tantalum oxide, a hafnium oxide, and a zirconium oxide.

10. The non-volatile memory device according to claim 9, wherein the first oxide region contains an oxide having a composition expressed as $TaO_x$ (0.8≤x≤1.9); and wherein the second oxide region contains an oxide having a composition expressed as $TaO_y$ (2.1≤y≤2.5).

11. The non-volatile memory device according to claim 7, wherein the voltage pulse application circuit is configured to apply the write voltage pulse such that the current of a magnitude greater than a maximum value of the current flowing through the metal oxide layer when the write voltage pulse has been applied in repetition is flowed, in a case where the voltage pulse application circuit applies the write voltage pulse after the voltage pulse application circuit has applied the write voltage pulse in repetition.

12. The non-volatile memory device according to claim 11, further comprising:

a verification means which verifies the resistance state of the metal oxide layer after the write voltage pulse is applied;

wherein the voltage pulse application circuit is configured to re-apply the write voltage pulse when the verification means determines that the write state has not been implemented, as a result of the verification; and wherein the voltage pulse application circuit is configured to apply the write voltage pulse such that the current of a magnitude greater than a maximum value of the current flowing through the metal oxide layer when the write voltage pulse has been re-applied plural times is flowed, in a case where the voltage pulse application circuit applies the write voltage pulse after the voltage pulse application circuit has re-applied the write voltage pulse plural times.

13. The non-volatile memory device according to claim 7, further comprising:

a current steering element electrically connected to the first electrode or the second electrode.

14. The non-volatile memory device according to claim 13, wherein the current steering element is a transistor.

15. The non-volatile memory device according to claim 13, wherein the current steering element is a diode.

* * * * *